US010965085B2

United States Patent
Katsuumi et al.

(10) Patent No.: US 10,965,085 B2
(45) Date of Patent: Mar. 30, 2021

(54) LASER CHAMBER WITH METAL DAMPER MEMBER

(71) Applicant: Gigaphoton Inc., Tochigi (JP)

(72) Inventors: Hisakazu Katsuumi, Oyama (JP); Hiroaki Tsushima, Oyama (JP)

(73) Assignee: Gigaphoton Inc., Tochigi (JP)

( * ) Notice: Subject to any disclaimer, the term of this patent is extended or adjusted under 35 U.S.C. 154(b) by 46 days.

(21) Appl. No.: 15/864,017

(22) Filed: Jan. 8, 2018

(65) Prior Publication Data

US 2018/0138650 A1 May 17, 2018

Related U.S. Application Data

(63) Continuation of application No. PCT/JP2015/072261, filed on Aug. 5, 2015.

(51) Int. Cl.
*H01S 3/032* (2006.01)
*H01S 3/097* (2006.01)
(Continued)

(52) U.S. Cl.
CPC ........ *H01S 3/0323* (2013.01); *G03F 7/70025* (2013.01); *H01S 3/09705* (2013.01);
(Continued)

(58) Field of Classification Search
CPC ............... H01S 3/0323; H01S 3/09713; H01S 3/09705; H01S 3/036; H01S 3/225; G03F 7/70025; G03F 7/2053; H01L 21/67225
See application file for complete search history.

(56) References Cited

U.S. PATENT DOCUMENTS 6,639,929 B2   10/2003   Mizoguchi et al.
6,914,919 B2   7/2005    Watson et al.
(Continued)

FOREIGN PATENT DOCUMENTS

CN   101425660 A    5/2009
JP   H04-129283 A   4/1992
(Continued)

OTHER PUBLICATIONS

International Search Report issued in PCT/JP2015/072261; dated Oct. 13, 2015.
(Continued)

*Primary Examiner* — M. A. Golub-Miller
(74) *Attorney, Agent, or Firm* — Studebaker & Brackett PC

(57) ABSTRACT

A laser chamber may include a first discharge electrode, a second discharge electrode, a fan making a laser gas flow through a discharge space between the first and second discharge electrodes, a first insulating member disposed on upstream side and downstream side of the first discharge electrode in the laser gas flow, a first metal damper member disposed on upstream side of the second discharge electrode and a second insulating member disposed on downstream side of the second discharge electrode in the laser gas flow, and a second metal damper member disposed on downstream side of the second insulating member in the laser gas flow. In a boundary portion between the second metal damper member and the second insulating member, a first discharge space side surface of the second metal damper member may be located further toward the opposite side to the discharge space than a second discharge space side surface of the second insulating member. A first corner formed by the first surface and a first side surface of the second metal damper member, the first side surface being on (Continued)

the side of the second insulating member, may be in contact with a second side surface of the second insulating member, the second side surface being on the side of the second metal damper member.

6 Claims, 9 Drawing Sheets

(51) Int. Cl.
*H01S 3/0971* (2006.01)
*G03F 7/20* (2006.01)
*H01S 3/225* (2006.01)
*H01S 3/036* (2006.01)
*H01S 3/03* (2006.01)
*H01L 21/67* (2006.01)

(52) U.S. Cl.
CPC ........ *H01S 3/09713* (2013.01); *G03F 7/2053* (2013.01); *H01L 21/67225* (2013.01); *H01S 3/03* (2013.01); *H01S 3/036* (2013.01); *H01S 3/225* (2013.01)

(56) References Cited

U.S. PATENT DOCUMENTS

| | | | | |
|---|---|---|---|---|
| 2003/0031225 | A1* | 2/2003 | Mizoguchi | H01S 3/225 372/55 |
| 2005/0047471 | A1* | 3/2005 | Steiger | H01S 3/0971 372/87 |
| 2006/0078028 | A1 | 4/2006 | Kakizaki et al. | |
| 2006/0272505 | A1 | 12/2006 | Tanaka et al. | |
| 2007/0002918 | A1* | 1/2007 | Niemoeller | H01S 3/0388 372/55 |
| 2014/0023101 | A1* | 1/2014 | Wang | H01S 3/2333 372/34 |
| 2016/0308324 | A1* | 10/2016 | Ikeda | H01S 3/09702 |
| 2016/0365696 | A1* | 12/2016 | Tsushima | H01S 3/038 |

FOREIGN PATENT DOCUMENTS

| | | |
|---|---|---|
| JP | H06-085350 A | 3/1994 |
| JP | 2003-060270 A | 2/2003 |
| JP | 2005-502210 A | 1/2005 |
| JP | 2006-148016 A | 6/2006 |
| JP | 2006-229137 A | 8/2006 |
| JP | 2007-208183 A | 8/2007 |
| WO | 03/021731 A1 | 3/2013 |

OTHER PUBLICATIONS

Written Opinion issued in PCT/JP2015/072261; dated Oct. 13, 2015.

An Office Action mailed by the State Intellectual Property Office of the People's Republic of China dated Aug. 2, 2019, which corresponds to Chinese Patent Application No. 201580081701.5 and is related to U.S. Appl. No. 15/864,017.

* cited by examiner

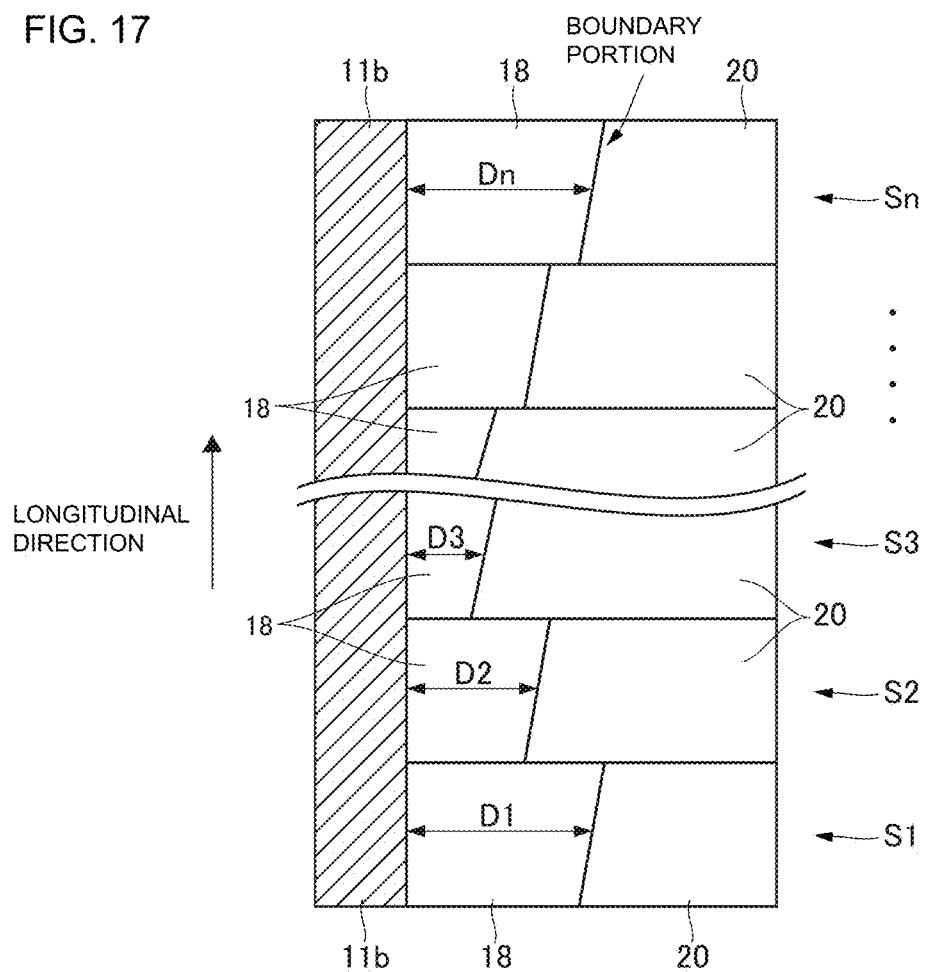
FIG. 17
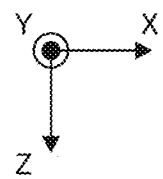

LASER CHAMBER WITH METAL DAMPER MEMBER

CROSS-REFERENCE TO RELATED APPLICATIONS

This application is a continuation application of International Application No. PCT/JP2015/072261 filed on Aug. 5, 2015. The content of the application is incorporated herein by reference in its entirety.

BACKGROUND

1. Technical Field

The present disclosure relates to a laser chamber.

2. Related Art

With miniaturization and high integration of a semiconductor integrated circuit, improvement of resolution is demanded in a semiconductor exposure apparatus (hereinafter, referred to as an "exposure apparatus"). Accordingly, the wavelength of light emitted from a light source for exposure is being shortened. As the light source for exposure, a gas laser apparatus is used in place of an existing mercury lamp. As the gas laser apparatus for exposure, a KrF excimer laser apparatus that emits ultraviolet rays of a wavelength of 248 nm and an ArF excimer laser apparatus that emits ultraviolet rays of a wavelength of 193 nm are currently employed.

As a current exposure technology, liquid immersion exposure has been used in practice, wherein a gap between a projection lens on an exposure apparatus side and a wafer is filled with a liquid to change the refractive index of the gap, thereby shortening the apparent wavelength of the light source for exposure. In the liquid immersion exposure using the ArF excimer laser apparatus as the light source for exposure, ultraviolet rays having a wavelength of 134 nm in water/liquid is applied to the wafer. This technology is called ArF liquid immersion exposure or ArF liquid immersion lithography.

Because the spectrum line width in natural oscillations of the KrF and ArF excimer laser apparatuses is so wide, about 350 pm to about 400 pm, that a color aberration occurs in a laser beam (ultraviolet rays) as projected in a reduced size on the wafer through the projection lens on the exposure apparatus side, degrading the resolution. Therefore, it is necessary to narrow the spectrum line width of the laser beam emitted from the gas laser apparatus such that the color aberration becomes ignorable. The spectrum line width is also called the spectrum width. Accordingly, a line narrowing module (LNM) having a line narrowing element is provided in a laser resonator of the gas laser apparatus, to achieve narrowing the spectrum width by the line narrowing module. Note that the line narrowing element may include an etalon, a grating and the like. The laser apparatus with a spectrum width narrowed in this way is called narrow-band laser apparatus.

CITATIONS

Patent Literature

PTL 1: JPA No. 2006-229137
PTL 2: JPA No. 2006-148016
PTL 3: U.S. Pat. No. 6,914,919
PTL 4: JP-T No. 2005-502210
PTL 5: U.S. Pat. No. 6,639,929
PTL 6: JPA No. 2003-60270
PTL 7: JPA No. 2007-208183

SUMMARY

A laser chamber according to one aspect of the present disclosure is a laser chamber of a discharge excitation type gas laser apparatus. The laser chamber may include a first discharge electrode disposed in the laser chamber, a second discharge electrode disposed as facing the first discharge electrode in the laser chamber, a fan configured to make a laser gas flow through a discharge space between the first and second discharge electrodes, a first insulating member disposed on upstream side and downstream side of the first discharge electrode in the laser gas flow, a first metal damper member disposed on upstream side of the second discharge electrode in the laser gas flow, a second insulating member disposed on downstream side of the second discharge electrode in the laser gas flow, and a second metal damper member disposed on downstream side of the second insulating member in the laser gas flow. In a boundary portion between the second metal damper member and the second insulating member, a first surface of the second metal damper member may be located further toward the opposite side to the discharge space than a second surface of the second insulating member, the first and second surfaces being on the side of the discharge space. A first corner formed by the first surface and a first side surface of the second metal damper member, the first side surface being on the side of the second insulating member, may be in contact with a second side surface of the second insulating member, the second side surface being on the side of the second metal damper member.

A laser chamber according to another aspect of the present disclosure is a laser chamber of a discharge excitation type gas laser apparatus. The laser chamber may include a first discharge electrode disposed in the laser chamber, a second discharge electrode disposed as facing the first discharge electrode in the laser chamber, a fan configured to make a laser gas flow through a discharge space between the first and second discharge electrodes, a first insulating member disposed on upstream side and downstream side of the first discharge electrode in the laser gas flow, a first metal damper member disposed on upstream side of the second discharge electrode in the laser gas flow, a second insulating member disposed on downstream side of the second discharge electrode in the laser gas flow, and a second metal damper member disposed on downstream side of the second insulating member in the laser gas flow. A first corner of the second metal damper member may be in contact with a second corner of the second insulating member. The first corner is formed by a first surface and a first side surface of the second metal damper member. The first surface is on the side of the discharge space, and the first side surface is on the side of the second insulating member. The second corner is formed by a second surface and a second side surface of the second insulating member. The second surface is on the side of the discharge space, and the second side surface is on the side of the second metal damper member. The first surface and the second surface may be located in substantially the same plane. The sum of the angle of the first corner and the angle of the second corner may be smaller than 180°.

A laser chamber according to another aspect of the present disclosure is a laser chamber of a discharge excitation type gas laser apparatus. The laser chamber may include a first discharge electrode disposed in the laser chamber, a second discharge electrode disposed as facing the first discharge electrode in the laser chamber, a fan configured to make a laser gas flow through a discharge space between the first and second discharge electrodes, a first insulating member disposed on upstream side and downstream side of the first discharge electrode in the laser gas flow, a first metal damper member disposed on upstream side of the second discharge electrode in the laser gas flow, a second insulating member disposed on downstream side of the second discharge electrode in the laser gas flow, and a second metal damper member disposed on downstream side of the second insulating member in the laser gas flow. The distance from the second discharge electrode to a boundary portion between the second metal damper member and the second insulating member may change from one position to another in the longitudinal direction of the second discharge electrode.

BRIEF DESCRIPTION OF DRAWINGS

Some embodiments of the disclosure will be described as an example below with reference to the accompanying drawings.

FIG. 17 is a diagram illustrating a second metal damper member and a second insulating member included in a laser chamber according to modification 2 of the fourth embodiment.

EMBODIMENTS

Contents

Figure 1:
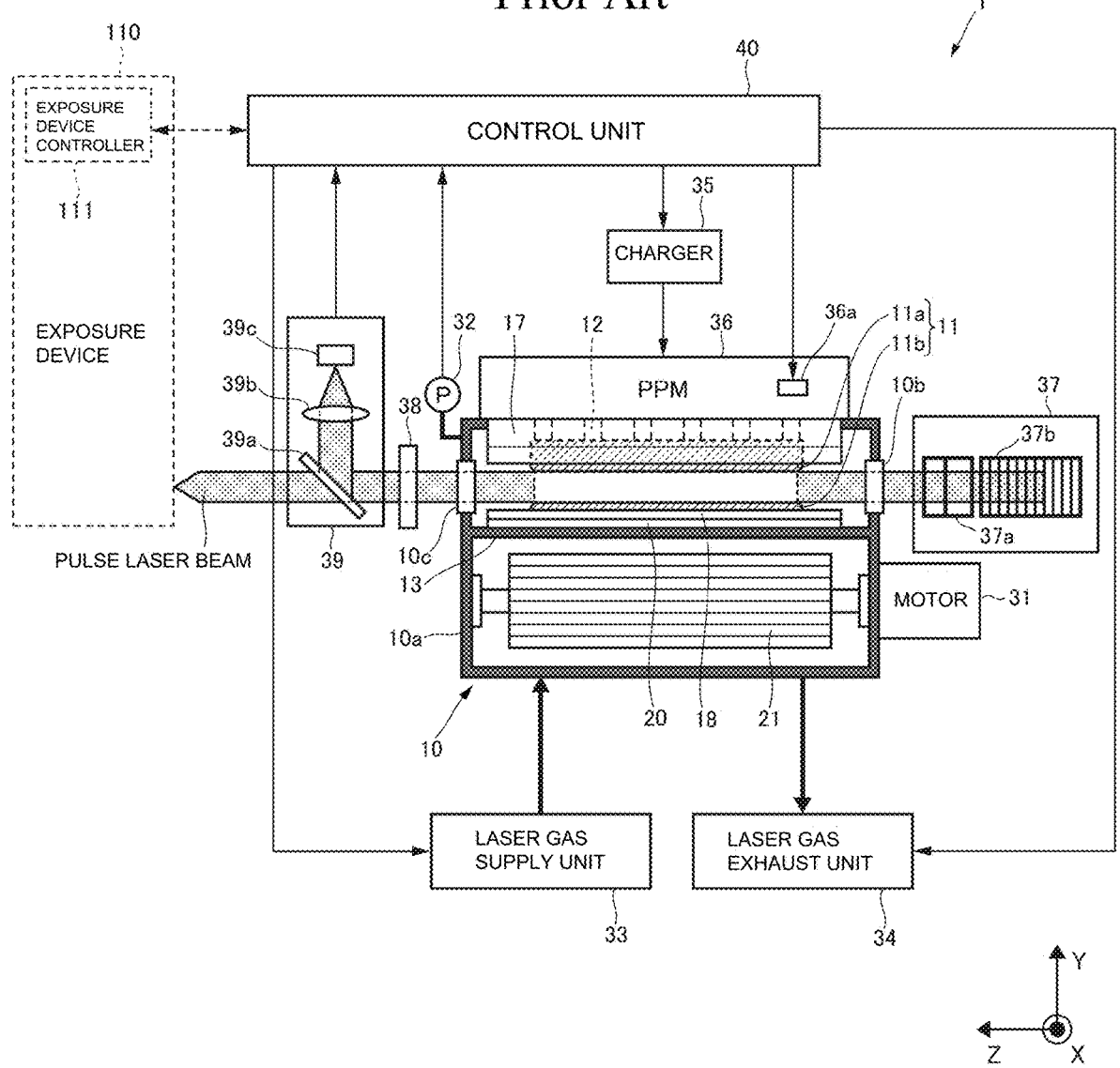
FIG. 1 is a diagram illustrating a gas laser apparatus according to a comparative example.

1. Terms
2. Problem
2.1 Configuration of Comparative Example
2.2 Operation of Comparative Example
2.3 Problem
3. First Embodiment
3.1 Configuration
3.2 Operation and Effect
3.3 Modification of First Embodiment
4. Second Embodiment
4.1 Configuration, Operation and Effect
4.2 Modification of Second Embodiment
5. Third Embodiment
5.1 Configuration, Operation and Effect
5.2 Modification of Third Embodiment
6. Fourth Embodiment
6.1 Configuration, Operation and Effect
6.2 Modification of Fourth Embodiment
7. Others In the following, some embodiments of the disclosure will be described in detail with reference to the drawings. The embodiments described below each illustrate one example of the disclosure and are not intended to limit the contents of the disclosure. Also, all of the configurations and operations described in the embodiments are not necessarily essential for the configurations and operations of the disclosure. Note that like elements are denoted with the same reference numerals, and any redundant description thereof is omitted.

1. Terms

"Optical path axis" is an axis extending in the traveling direction of the laser beam through the center of the beam cross section of the laser beam.

"Optical path" is a path along which the laser beam travels. The optical path may include the optical path axis.

"Discharge space" is a space located between a pair of discharge electrodes, in which discharge can occur for exciting a laser gas between the pair of discharge electrodes.

"Discharge surface" is a surface defining the discharge space on each of the discharge electrodes constituting the pair of discharge electrodes. The discharge surface of one discharge electrode and the discharge surface of the other discharge electrode face each other.

"Discharge product" is an ion or an active species produced by ionization of the laser gas by the discharge occurring in the discharge space.

"Z-axis" is a central axis of the discharge space in a chamber of a gas laser apparatus.

"Z-axis direction" is a direction which substantially coincides with the direction in which the pulse laser beam travels.

"Y-axis" is an axis orthogonal to the Z-axis which is the central axis of the discharge space in the chamber of the gas laser apparatus. The Y-axis extends in the direction in which the pair of discharge electrodes face each other.

"Y-axis direction" is a direction in which the current flows at the discharge occurring in the discharge space.

"X-axis" is an axis orthogonal to the Z-axis which is the central axis of the discharge space in the chamber of the gas laser apparatus. The X-axis is orthogonal to the Y-axis which extends in the direction in which the pair of discharge electrodes face each other.

"X-axis direction" is a direction in which the laser gas flows through the discharge space.

"Upstream" indicates upstream in the laser gas flow through the discharge space.

"Downstream" indicates downstream in the laser gas flow through the discharge space.

2. Problem

Figure 2:
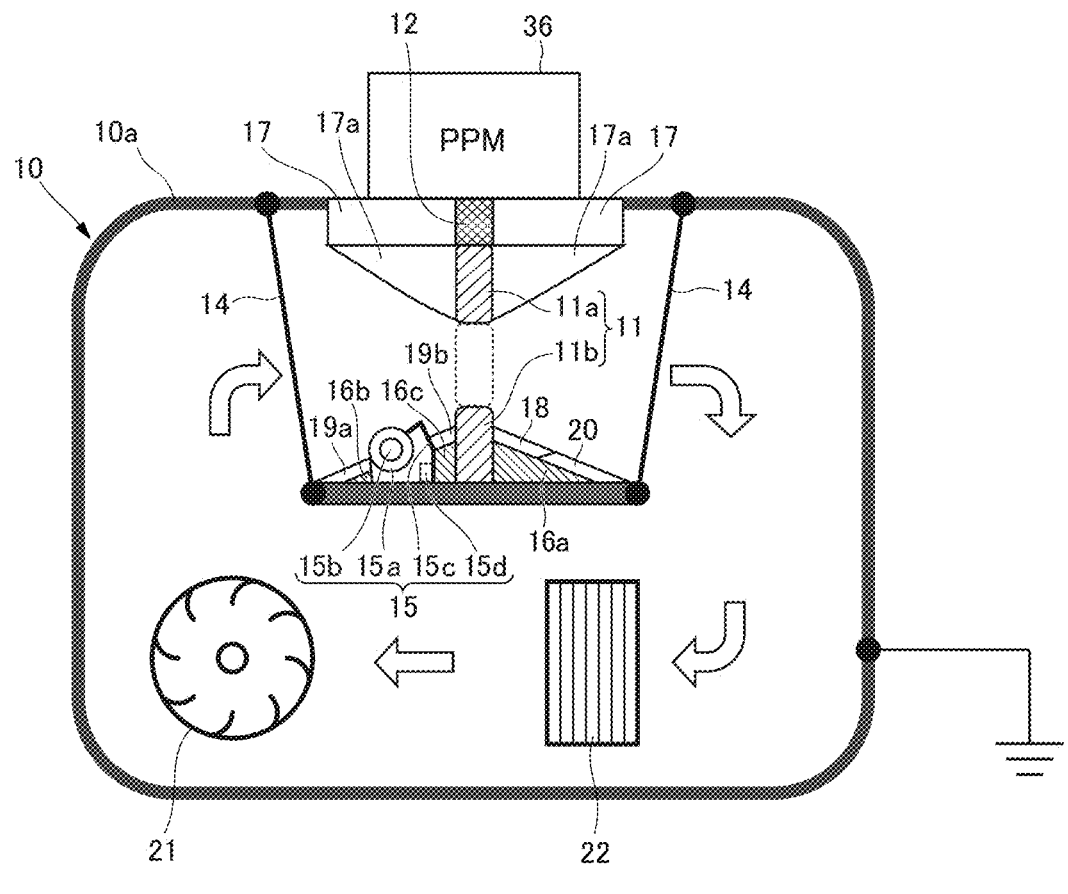
FIG. 2 is a diagram illustrating a laser chamber of the gas laser apparatus shown in FIG. 1, as viewed from the Z-axis direction.
Figure 3:
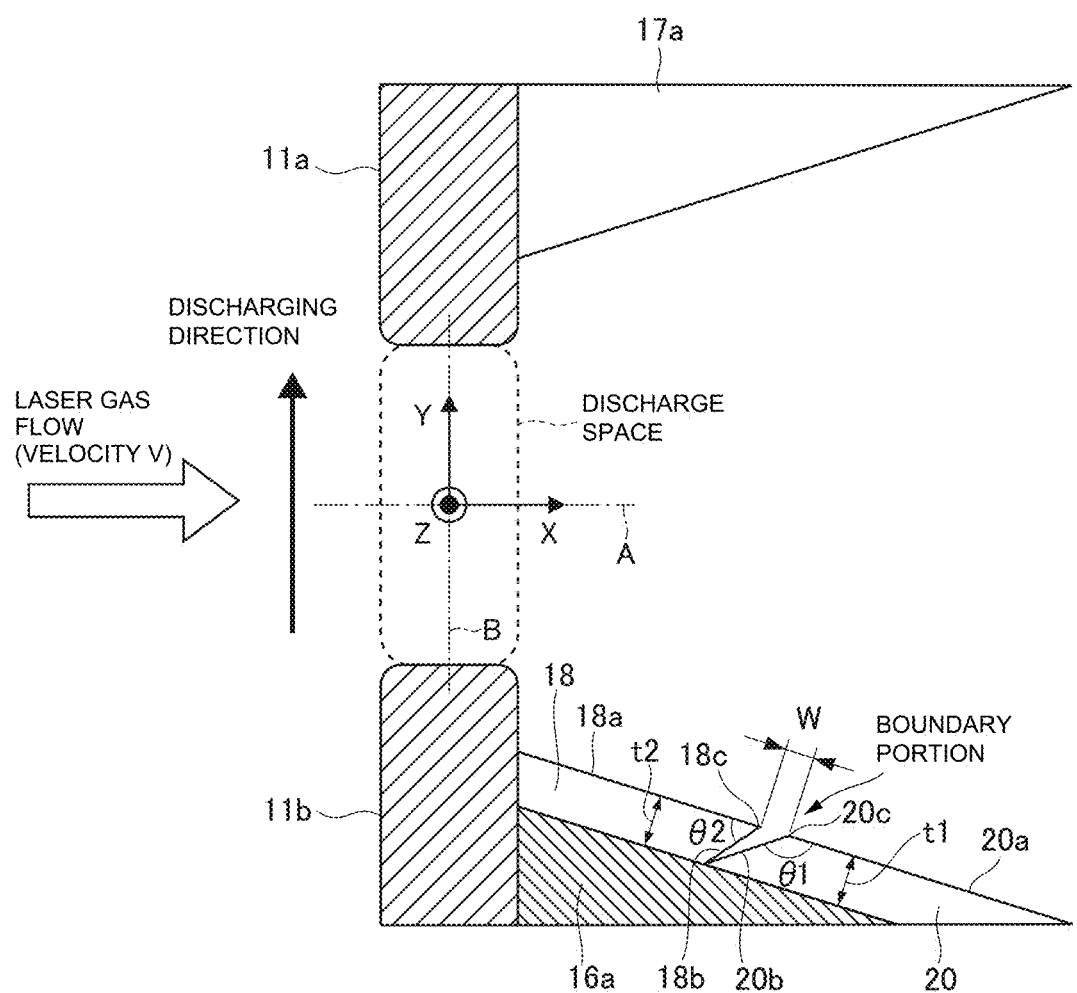
FIG. 3 is a diagram for explaining a problem of the laser chamber of the comparative example.

Referring to FIG. 1 to FIG. 3, a gas laser apparatus 1 provided with a laser chamber 10 of a comparative example and a problem of the comparative example will be described.

The gas laser apparatus 1 according to the comparative example may be a discharge excitation gas laser apparatus. The gas laser apparatus 1 may be an excimer laser apparatus. The laser gas, which is a laser medium, may be composed of argon or krypton or xenon as a rare gas, fluorine or chlorine as a halogen gas, and neon or helium or a mixed gas thereof as a buffer gas.

2.1 Configuration of Comparative Example

FIG. 1 is a diagram illustrating the gas laser apparatus 1 according to the comparative example. FIG. 2 is a diagram illustrating the laser chamber 10 shown in FIG. 1 as viewed from the Z-axis direction. In FIG. 1 and FIG. 2, X-, Y- and Z-axes are shown in one corner of each drawing in order to clearly illustrate the components of the gas laser apparatus 1.

The gas laser apparatus 1 may include the laser chamber 10, a laser resonator, a motor 31, a pressure sensor 32, a laser gas supply unit 33 and a laser gas exhaust unit 34. The gas laser apparatus 1 further includes a charger 35, a pulse power module (PPM) 36, a pulse energy meter 39 and a control unit 40.

The laser chamber 10 may have a laser gas encapsulated therein.

A wall 10a that forms an internal room of the laser chamber 10 may be formed, for example, from a metal material, such as aluminum. The surface of the metal material may be treated with nickel plating, for example.

The wall 10a of the laser chamber 10 may be connected to ground.

The laser chamber 10 may include a pair of discharge electrodes 11, feedthroughs 12, a plate 13, wirings 14, a pre-ionization discharge unit 15, metal members 16a to 16c, a first insulating member 17, a second insulating member 18, first metal damper members 19a and 19b, and a second metal damper member 20. The laser chamber 10 may further include a fan 21 and a heat exchanger 22.

The pair of discharge electrodes 11 may include a first discharge electrode 11a and a second discharge electrode 11b.

The first and second discharge electrodes 11a and 11b may be electrodes for exciting the laser gas by main discharge in a discharge space between the first and second discharge electrodes 11a and 11b. The main discharge may be glow discharge.

The first and second discharge electrodes 11a and 11b may be formed of a metal material including copper for use with a halogen gas containing fluorine, or a metal material including nickel for use with a halogen gas containing chlorine.

The first and second discharge electrodes 11a and 11b may be spaced a given distance from each other and arranged to face each other, with the longitudinal direction thereof in parallel to each other.

The first and second discharge electrodes 11a and 11b may be a cathode electrode and an anode electrode, respectively.

Ends of the feedthroughs 12 on one side may be connected to a bottom surface of the first discharge electrode 11a, which is on the opposite side to a discharge surface of the first discharge electrode 11a.

Ends of the feedthroughs 12 on the other side may be connected to a negative output terminal of the pulse power module 36.

The plate 13 may be connected to a surface of the second discharge electrode 11b, which is on the opposite side to a discharge surface of the second discharge electrode 11b. The plate 13 may support the second discharge electrode 11b.

The plate 13 may be formed of a metal material that hardly reacts with the laser gas. The plate 13 may be formed of a metal material including aluminum, copper and the like. The surface of the plate 13 may be treated with nickel plating.

The plate 13 may be secured to the wall 10a of the laser chamber 10.

The plate 13 may be electrically connected to the wall 10a of the laser chamber 10 through the wiring 14.

One end of the wiring 14 may be connected to the plate 13.

The other end of the wiring 14 may be connected to a ground terminal of the pulse power module 36 through the wall 10a of the laser chamber 10.

Multiple wirings 14 may be provided at predetermined intervals in the longitudinal direction of the first and second discharge electrodes 11a and 11b.

The pre-ionization discharge unit 15 may be electrodes for pre-ionizing the laser gas by corona discharge as a process prior to the main discharge across the pair of discharge electrodes 11.

The pre-ionization discharge unit 15 may be secured to the plate 13.

The pre-ionization discharge unit 15 may be disposed on upstream side of the second discharge electrode 11b in a laser gas flow that flows through the discharge space.

The pre-ionization discharge unit 15 includes a dielectric pipe 15a, an internal pre-ionization electrode 15a, an external pre-ionization electrode 15c and a bolt 15d.

The dielectric pipe 15a may be disposed such that the longitudinal direction of the dielectric pipe 15a is substantially parallel to the longitudinal direction of the second discharge electrode 11b.

The internal pre-ionization electrode 15b may be inserted in the dielectric pipe 15a and secured to the inner peripheral surface of the dielectric pipe 15a. End portions of the internal pre-ionization electrode 15b may be connected to the pulse power module 36 through the feedthroughs 12.

The external pre-ionization electrode 15c may be formed into a plate shape having bent portions and secured to the metal member 16c with the bolt 15d.

The metal member 16a may hold the second discharge electrode 11b so as to cover a downstream side surface of the second discharge electrode 11b.

The metal member 16a may be formed into a triangular prism shape extending in the longitudinal direction of the second discharge electrode 11b.

The metal member 16a may be formed of a metal material that hardly reacts with the laser gas. The metal member 16a is formed of a metal material, including aluminum, copper and the like, and the surface thereof may be treated with nickel plating.

The metal member 16a may be fixed on the plate 13. The metal member 16a may be formed integrally with the plate 13.

The metal member 16a may be disposed on downstream side of the second discharge electrode 11b in the laser gas flow.

The metal member 16a may be formed to become thinner from upstream side to downstream side thereof. The metal member 16a may have an inclined surface which is inclined toward the opposite side to the discharge space in the direction from the upstream side to the downstream side. That is, a discharge space side surface of the metal member 16a may be formed to be the inclined surface which is inclined farther away from the XZ-plane in the positive direction of the X-axis, which is indicated by an arrow. In other words, the discharge space side surface of the metal member 16a may be formed to be the inclined surface which is inclined farther away from the discharge space in the flowing direction of the laser gas.

The inclined surface of the metal member 16a may support the second insulating member 18 and the second metal damper member 20.

The metal members 16b and 16c may hold the second discharge electrode 11b so as to cover an upstream side surface of the second discharge electrode 11b.

The metal members 16b and 16c may be formed into a columnar shape extending in the longitudinal direction of the second discharge electrode 11b.

The metal members 16b and 16c, as well as the metal member 16a, may be formed of a metal material that hardly reacts with the laser gas. The metal members 16b and 16c is formed of a metal material including aluminum, copper and the like, and the surface thereof may be treated with nickel plating.

The metal members 16b and 16c may be fixed on the plate 13. The metal members 16b and 16c may be formed integrally with the plate 13.

The metal members 16b and 16c may be disposed on the upstream side of the second discharge electrode 11b in the laser gas flow.

The metal members 16b and 16c may be formed to become thicker from upstream side to downstream side thereof. The metal members 16b and 16c may have inclined surfaces which are inclined toward the discharge space in the direction from the upstream side to the downstream side. That is, discharge space side surfaces of the metal members 16b and 16c may be formed to be the inclined surfaces which are inclined to become closer to the XZ-plane in the positive direction of the X-axis. In other words, the discharge space side surfaces of the metal members 16b and 16c may be formed to be the inclined surfaces which are inclined to become closer to the discharge space in the flowing direction of the laser gas.

The inclined surfaces of the metal members 16b and 16c may support the first metal damper members 19a and 19b thereon, respectively.

The first insulating member 17 may be a member for electrically insulating the first discharge electrode 11a and the feedthroughs 12 from the wall 10a of the laser chamber 10.

The first insulating member 17 may hold the first discharge electrode 11a and the feedthroughs 12 while surrounding side surfaces of the first discharge electrode 11a and those of the feedthroughs 12.

The first insulating member 17 may be formed of an insulating material that hardly reacts with the laser gas. If the laser gas contains fluorine or chlorine, the first insulating member 17 may be formed, for example, of high-purity alumina ceramics.

The first insulating member 17 may be secured to the wall 10a of the laser chamber 10.

The first insulating member 17 may be disposed on upstream side and downstream side of the first discharge electrode 11a in the laser gas flow.

The first insulating member 17 may include guide portions 17a.

The guide portions 17a may be located on the discharge space side of the first insulating member 17 and may constitute a part for efficiently introducing the laser gas into the discharge space while the laser gas is being circulated by the fan 21.

The guide portion 17a located on the upstream side of the first discharge electrode 11a may be formed to become thicker from upstream side to downstream side thereof. The guide portion 17a located on the upstream side of the first discharge electrode 11a may have an inclined surface inclined toward the discharge space in the direction from the upstream side to the downstream side. That is, a discharge space side surface of the guide portion 17a which is located on the upstream side of the first discharge electrode 11a may be formed to be the inclined surface which is inclined to become closer to the XZ-plane in the positive direction of the X-axis. In other words, the discharge space side surface of the guide portion 17a located on the upstream side of the first discharge electrode 11a may be formed to be the inclined surface which is inclined to become closer to the discharge space in the flowing direction of the laser gas.

The guide portion 17a located on the downstream side of the first discharge electrode 11a may be formed to become thinner from upstream side to downstream side thereof. The guide portion 17a located on the downstream side of the first discharge electrode 11a may have an inclined surface which is inclined toward the opposite side to the discharge space in the direction from the upstream side to the downstream side. That is, a discharge space side surface of the guide portion 17a which is located on the downstream side of the first discharge electrode 11a may be formed to be the inclined surface which is inclined farther away from the XZ-plane in the positive direction of the X-axis. In other words, the discharge space side surface of the guide portion 17a located on the downstream side of the first discharge electrode 11a may be formed to be the inclined surface which is inclined farther away from the discharge space in the flowing direction of the laser gas.

The second insulating member 18 may be a member that prevents abnormal discharge from the first discharge electrode 11a through the discharge products toward the second discharge electrode 11b and the metal member 16a.

The second insulating member 18 may hold the second discharge electrode 11b while covering the downstream side of the second discharge electrode 11b.

The second insulating member 18 may be formed into a plate shape extending in the longitudinal direction of the second discharge electrode 11b.

The second insulating member 18 may be formed of an insulating material that hardly reacts with the laser gas. If the laser gas contains fluorine or chlorine, the second insulating member 18 may be formed, for example, of high-purity alumina ceramics.

The second insulating member 18 may be disposed on the downstream side of the second discharge electrode 11b in the laser gas flow. The second insulating member 18 may be disposed adjacent to the second discharge electrode 11b on the downstream side of the second discharge electrode 11b in the laser gas flow.

The second insulating member 18 may be fixed on the inclined surface of the metal member 16a. The second insulating member 18 may be inclined along the inclined surface of the metal member 16a. A discharge space side surface 18a of the second insulating member 18 may be inclined toward the opposite side to the discharge space in the direction from the upstream side to the downstream side. That is, the discharge space side surface 18a of the second insulating member 18 may be formed to be the inclined surface which is inclined farther away from the XZ-plane in the positive direction of the X-axis. In other words, the discharge space side surface 18a of the second insulating member 18 may be formed to be the inclined surface which is inclined farther away from the discharge space in the flowing direction of the laser gas.

The discharge space side surface 18a of the second insulating member 18 can conduct the laser gas efficiently outward from the discharge space while the laser gas is being circulated by the fan 21.

The second insulating member 18 may be disposed to face the discharge products which are accumulated in the vicinity of the discharge space. Thus, it is possible to prevent the abnormal discharge from the first discharge electrode 11a through the discharge products toward the metal member 16a and the second metal damper member 20.

The first metal damper members 19a and 19b may be a sound absorbing member that absorbs an acoustic wave generated with the main discharge in the discharge space.

The first metal damper members 19a and 19b may hold the second discharge electrode 11b so as to cover the upstream side surface of the second discharge electrode 11b. The first metal damper members 19a and 19b may be arranged so as to surround the side surfaces of the pre-ionization discharge unit 15. The first metal damper members 19a and 19b may be fixed on the metal members 16b and 16c, respectively.

The first metal damper members 19a and 19b may be formed using at least one of a porous metal, a foam metal and a reticulated metal. The materials of these metals may be such metal materials that hardly react with the laser gas. If the laser gas contains fluorine, the materials of these metals may be at least one of aluminum, copper and nickel, for example. If the laser gas contains chlorine, the materials of these metals may be either of nickel and aluminum, for example.

The first metal damper members 19a and 19b may be disposed on upstream side of the second discharge electrode 11b in the laser gas flow. The first metal damper members 19a and 19b may be disposed adjacent to the second discharge electrode 11b on upstream side of the second discharge electrode 11b in the laser gas flow. The first metal damper member 19a may be disposed on upstream side of the pre-ionization discharge unit 15. The first metal damper member 19b may be disposed between the second discharge electrode 11b and the pre-ionization discharge unit 15.

The first metal damper members 19a and 19b may have inclined surfaces inclined toward the discharge space in the direction from the upstream side to the downstream side. That is, discharge space side surfaces of the first metal damper members 19a and 19b may be formed to be the inclined surfaces which are inclined to become closer to the XZ-plane in the positive direction of the X-axis. In other words, the discharge space side surfaces of the first metal damper members 19a and 19b may be formed to be the inclined surfaces which are inclined to become closer to the discharge space in the flowing direction of the laser gas.

The discharge space side surfaces of the first metal damper members 19a and 19b can efficiently introduce the laser gas into the discharge space while the laser gas is being circulated by the fan 21.

Like the first metal damper members 19a and 19b, the second metal damper member 20 may be a sound absorbing member that absorbs the acoustic wave generated with the main discharge in the discharge space.

The second metal damper member 20 may be formed into a plate shape extending in the longitudinal direction of the second discharge electrode 11b.

Like the first metal damper members 19a and 19b, the second metal damper member 20 may be formed using at least one of a porous metal, a foamed metal and a reticulated metal. The materials of these metals may be such metal materials that hardly react with the laser gas. If the laser gas contains fluorine, the materials of these metals may be at least one of nickel, aluminum and copper, for example. If the laser gas contains chlorine, the material of these metals may be either of nickel and aluminum, for example. The second metal damper member 20 may be formed of substantially the same material as that of the first metal damper members 19a and 19b.

The second metal damper member 20 may be disposed on downstream side of the second insulating member 18 in the laser gas flow. The second metal damper member 20 may be arranged adjacent to the second insulating member 18 on the downstream side of the second insulating member 18 in the laser gas flow.

The second metal damper member 20 may be fixed on the inclined surface of the metal member 16a. The second metal damper member 20 may be inclined along the inclined surface of the metal member 16a. A discharge space side surface 20a of the second metal damper member 20 may be inclined toward the opposite side to the discharge space in the direction from the upstream side to the downstream side. That is, the discharge space side surface 20a of the second metal damper member 20 may be formed to be the inclined surface which is inclined farther away from the XZ-plane in the positive direction of the X-axis. In other words, the discharge space side surface 20a of the second metal damper member 20 may be formed to be the inclined surface which is inclined farther away from the discharge space in the flowing direction of the laser gas.

The discharge space side surface 20a of the second metal damper member 20 may efficiently conduct the laser gas outward from the discharge space while the laser gas is being circulated by the fan 21.

The discharge space side surface 20a of the second metal damper member 20 and the discharge space side surface 18a of the second insulating member 18 may be located in substantially the same plane. The thickness of the second metal damper member 20 may be substantially equal to the thickness of the second insulating member 18.

It is to be noted that, if the first metal damper members 19a and 19b and the second metal damper member 20 would be replaced by such damper members that are made of a ceramic material or a resin material, debris or dusts would be generated by the impact of the acoustic wave, which can make the main discharge unstable. It is therefore preferable to provide the laser chamber 10 with the first metal damper members 19a and 19b and the second metal damper member 20.

The fan 21 may circulate the laser gas in the laser chamber 10.

The fan 21 may be a cross flow fan.

The fan 21 may be arranged such that the longitudinal direction of the fan 21 is substantially parallel to the longitudinal direction of the first and second discharge electrodes 11a and 11b. The flowing direction of the laser gas can be substantially perpendicular to the longitudinal direction of the first and second discharge electrodes 11a and 11b.

The fan 21 may be magnetically levitated by a not-shown magnetic bearing, and may be driven to rotate by the motor 31.

The heat exchanger 22 may exchange heat between the laser gas and a refrigerant supplied into the heat exchanger 22.

The operation of the heat exchanger 22 may be controlled by the control unit 40.

The motor 31 may rotate the fan 21.

The motor 31 may be a DC motor or an AC motor.

The operation of the motor 31 may be controlled by the control unit 40.

The pressure sensor 32 may detect the gas pressure in the laser chamber 10.

The pressure sensor 32 may output a detection signal corresponding to the detected gas pressure to the control unit 40.

The laser gas supply unit 33 may supply the laser gas into the laser chamber 10.

The laser gas supply unit 33 may be constituted of components including a gas cylinder and a flow regulator, which are not shown in the drawings.

The operation of the laser gas supply unit 33 may be controlled by the control unit 40.

The laser gas exhaust unit 34 may let out the laser gas from the laser chamber 10 to the outside of the laser chamber 10.

The laser gas exhaust unit 34 may be constituted of components including an exhaust pump and a valve, which are not shown in the drawings.

The operation of the laser gas exhaust unit 34 may be controlled by the control unit 40.

The charger 35 may be a DC power supply apparatus for charging a charging capacitor C0, which is not shown but included in the pulse power module 36, at a predetermined voltage.

The operation of the charging device 35 may be controlled by the control unit 40.

The pulse power module 36 may apply a high pulse voltage across the pair of discharge electrodes 11.

The pulse power module 36 may apply the pulse voltage across the internal pre-ionization electrodes 15b and the external pre-ionization electrode 15c, which are included in the pre-ionization discharge unit 15.

The pulse power module 36 may be configured with a magnetic compressor circuit which makes use of magnetic saturation of a magnetic switch to compress a pulse.

The pulse power module 36 may include a switch 36a. The switch 36a may be a semiconductor switch.

The operation of the pulse power module 36 may be controlled by the control unit 40 which turns the switch 36a ON or OFF.

The laser resonator may be constituted of a line narrowing module (LNM) 37 and an output coupler (OC) 38.

The line narrowing module 37 may include a prism 37a and a grating 37b.

The prism 37a may enlarge the beam width of light being output from the laser chamber 10 through a window 10b. The prism 37a may transmit the light with an enlarged beam width to the grating 37b.

The grating 37b may be a wavelength dispersion element having a large number of grooves formed at predetermined intervals on the surface thereof.

The grating 37b may be arranged in a Littrow arrangement, in which the incident angle is equal to the diffraction angle.

Selectively from the light transmitted through the prism 37a, the grating 37b may reflect and diffract those rays having wavelengths around a specific value depending on the diffraction angle, thereby returning the rays back to the laser chamber 10. The spectral width of the rays returned from the grating 37b to the laser chamber 10 can be narrowed.

The output coupler 38 may transmit one part of the rays output from the laser chamber 10 through a window 10c as a pulse laser beam, and may reflect other parts of the rays so as to return to the laser chamber 10.

A surface of the output coupler 38 may be coated with a partial reflection film.

The pulse energy meter 39 may measure the pulse energy of the pulse laser beam transmitted through the output coupler 38.

The pulse energy meter 39 may include a beam splitter 39a, a condenser lens 39b and an optical sensor 39c.

The beam splitter 39a may be disposed in the optical path of the pulse laser beam. After the pulse laser beam is transmitted through the output coupler 38, the beam splitter 39a may transmit the pulse laser beam at a high transmittance toward an exposure device 110. The beam splitter 39a may partly reflect the pulse laser beam transmitted through the output coupler 38 toward the condenser lens 39b.

The condenser lens 39b may focus the pulse laser beam reflected from the beam splitter 39a on a light receiving surface of the light sensor 39c.

The light sensor 39c may detect the pulse laser beam focused on the light receiving surface. The light sensor 39c may measure the pulse energy of the detected pulse laser beam. The light sensor 39c may output a signal indicating the measured pulse energy to the control unit 40.

The control unit 40 may send and receive various kinds of signals to and from an exposure device controller 111 provided in the exposure device 110.

For example, a signal designating a target pulse energy Et of the pulse laser beam to be output to the exposure device 110 may be sent from the exposure device controller 111 to the control unit 40. A light emission trigger signal for giving a cue for starting the laser output operation may be sent from the exposure device controller 111 to the control unit 40.

The control unit 40 may comprehensively control the operation of each component of the gas laser apparatus 1 on the basis of various kinds of signals sent from the exposure device controller 111, 2.2 Operation of Comparative Example The control unit 40 of the gas laser apparatus 1 may receive a signal that instructs preparation for a laser output, the signal being sent from the exposure device controller 111.

The control unit 40 may rotate the fan 21 by controlling the motor 31.

Then the laser gas can circulate around inside the laser chamber 10. The laser gas can flow through the discharge space between the pair of discharge electrodes 11. The laser gas can flow through the discharge space toward the heat exchanger 22, to be cooled while passing through the heat exchanger 22. The laser gas having passed through the heat exchanger 22 can pass through the fan 21 and flow again toward the discharge space inside the laser chamber 10.

The control unit 40 may receive the signal designating the target pulse energy Et, the signal being sent from the exposure device controller 111.

The control unit 40 may set a voltage Vhv corresponding to the target pulse energy Et to the charger 35.

The charger 35 may charge the charging capacitor C0 based on the set voltage Vhv.

The control unit 40 may receive the light emission trigger signal from the exposure device controller 111.

The control unit 40 may output the light emission trigger signal to the switch 36a of the pulse power module 36.

When the light emission trigger signal is input to the switch 36a, the switch 36a can be turned ON. Then, a pulse current can be conducted from the charging capacitor C0 to a magnetic compression circuit in the pulse power module 36, and thus the pulse power module 36 can compress the pulse width. The pulse power module 36 may apply the pulse voltage across the internal and external pre-ionization electrodes 15b and 15c, as well as across the pair of discharge electrodes 11.

Thereby, the laser gas in the discharge space between the pair of discharge electrodes 11 can be pre-ionized. When the pulse voltage applied across the pair of discharge electrodes 11 exceeds the withstand voltage of the laser gas, the laser gas can break down. Then, the main discharge can occur in the discharge space between the pair of discharge electrodes 11. The direction in which electrons move at the main discharge can be from the first discharge electrode 11a being the cathode electrode to the second discharge electrode 11b being the anode electrode.

The occurrence of the main discharge enables exciting the laser gas to emit light in the discharge space between the pair of discharge electrodes 11.

The light emitted from the laser gas can be reflected by the line narrowing module 37 and the output coupler 38, which constitute the laser resonator, and thus reciprocate inside the laser resonator. While the light is reciprocating in the laser resonator, the bandwidth of the light can be narrowed by the line narrowing module 37. The light reciprocating in the laser resonator is amplified every time the light passes through the space between the pair of discharge electrodes 11.

Thereafter, a part of the amplified light can be transmitted through the output coupler 38. The light transmitted through the output coupler 38 can be output as the pulse laser beam to the exposure device 110.

The pulse laser beam transmitted through the output coupler 38 may partly fall on the pulse energy meter 39. The pulse energy meter 39 may measure the pulse energy of the incident pulse laser beam and output the measured pulse energy value E to the control unit 40.

The control unit 40 may make a feedback control of the voltage Vhv to be set to the charger 35 in accordance with the difference between the measured pulse energy value E and the target pulse energy Et.

If the voltage Vhv to be set to the charger 35 is above the upper limit of an allowable range, the control unit 40 may control the laser gas supply unit 33 to supply the laser gas into the laser chamber 10 until the gas pressure becomes a predetermined value.

Meanwhile, if the voltage Vhv to be set to the charger 35 is below the lower limit of the allowable range, the control unit 40 may control the laser gas exhaust unit 34 to let out the laser gas from the laser chamber 10 until the gas pressure becomes a predetermined value.

2.3 Problem

FIG. 3 is a diagram for explaining the problem of the laser chamber 10 of the comparative example.

When the main discharge occurs, the acoustic wave can be generated in the discharge space between the pair of discharge electrodes 11.

The acoustic wave can be reflected back to the discharge space by those components located in the vicinity of the pair of discharge electrodes 11. Thereby, the density of the laser gas flowing through the discharge space can fluctuate, making the main discharge unstable. As a result, the performance of the output pulse laser beam can be degraded.

Here, the guide portions 17a located in the vicinity of the first discharge electrode 11a may be made of an electrically insulating material. Furthermore, the acoustic wave can reach the guide portions 17a. Therefore, it may be possible to absorb the acoustic wave which can reach the guide portion 17a by applying the guide portion 17a, which may be made of an electrically insulating material, as a damper member. However, such a damper member that is made of an electrically insulating material and also has a desirable capability of effectively absorbing the acoustic wave is not commercially available. Accordingly, the guide portions 17a are configured as a part of the first insulating member 17, and the acoustic wave that has reached the guide portions 17a can be reflected therefrom.

Therefore, in the gas laser apparatus 1 according to the comparative example, the first metal damper members 19a and 19b and the second metal damper member 20 are disposed in the vicinity of the second discharge electrode 11b so that the acoustic wave can be absorbed in these members. Thus, the gas laser apparatus 1 according to the comparative example can prevent the influence of the acoustic wave from degrading the performance of the pulse laser beam.

However, concerning the acoustic wave that can return to the discharge space, there is a margin for improvement in the laser chamber 10 of the comparative example, addressing a problem due to processing accuracy of the second metal damper member 20.

For example, as shown in FIG. 3, θ1 represents the angle of a corner 20c formed by the discharge space side surface 20a of the second metal damper member 20 and a side surface 20b of the second metal damper member 20, the side surface 20b being on the side of the second insulating member 18. θ2 represents the angle of a corner 18c formed by the discharge space side surface 18a of the second insulating member 18 and a side surface 18b of the second insulating member 18, the side surface 18b being on the side of the second metal damper member 20. Note that the thickness t1 of the second metal damper member 20 is assumed to be substantially equal to the thickness t2 of the second insulating member 18.

In this case, the angle θ2 of the second insulating member 18 and the angle θ1 of the second metal damper member 20 can vary within respective ranges of processing tolerance. In particular, since the second metal damper member 20 can be formed using at least one of a porous metal, a foamed metal and a reticulated metal, the angle θ1 can vary more largely than the angle θ2.

Therefore, the sum of the angles θ1 and θ2 can become smaller than 180° and thus a gap W open to the discharge space side can be formed in the boundary portion between the second metal damper member 20 and the second insulating member 18. The size of the gap W can vary in the range of 0 to 0.37 mm, for example.

Therefore, in the laser chamber 10 of the comparative example, the acoustic wave caused by the main discharge can enter the gap W. Then the acoustic wave can be reflected backward into the discharge space.

As a result, in the laser chamber 10 of the comparative example, the performance of the pulse laser beam can be degraded by the influence of the acoustic wave.

Therefore, such a technology has been desired that can prevent the performance degradation of the pulse laser beam caused by the influence of the acoustic wave, even if the second metal damper member 20 has the dimensional variance.

Here, referring to FIG. 3, the X-, Y- and Z-axes will be described in detail.

As described above, the Z-axis is the central axis of the discharge space.

A plane located centrally between the discharge surfaces of the first and second discharge electrodes 11a and 11b will be called central plane A. A plane extending through lateral centers of the first and second discharge electrodes 11a and 11b substantially in parallel to the direction in which the first and second discharge electrodes 11a and 11b face each other will be called central plane B, the lateral center being a center position of each electrode in the lateral direction thereof that corresponds to the flowing direction of the laser gas.

Then, the central plane A and the central plane B can substantially orthogonally intersect with each other. The Z-axis may be an axis along the intersection between the central plane A and the central plane B.

Furthermore, as described above, the Y-axis is orthogonal to the Z-axis which is the central axis of the discharge space, and the Y-axis extends in the direction in which the first and second discharge electrodes 11a and 11b face each other.

The Y-axis may be included in the central plane B and substantially perpendicular to the central plane A. Where the first discharge electrode 11a is the cathode electrode and the second discharge electrode 11b is the anode electrode, the Y-axis direction may be the direction in which the current flows at the main discharge that occurs in the discharge space.

Also, as described above, the X-axis is orthogonal to the Z-axis which is the central axis of the discharge space, and the X-axis is orthogonal to the Y-axis which extends in the direction in which the first and second discharge electrodes 11a and 11b face each other.

The X-axis may be included in the central plane A and substantially perpendicular to the central plane B. The X-axis direction may be the direction in which the laser gas flows through the discharge space.

3. First Embodiment

Figure 4:
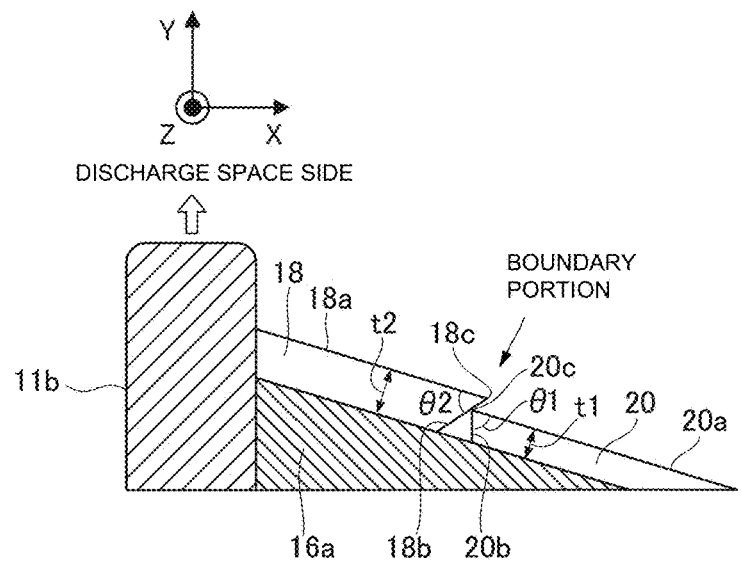
FIG. 4 is a diagram illustrating a second metal damper member and a second insulating member included in a laser chamber of a first embodiment.
Figure 5:
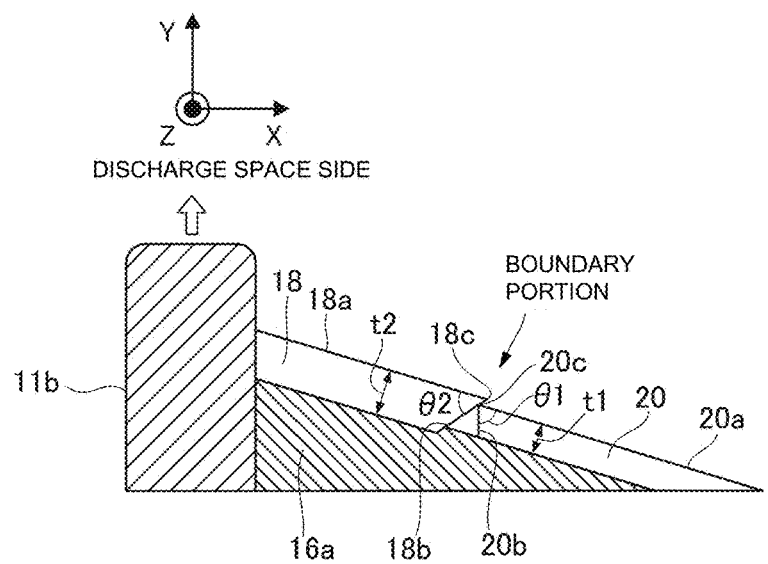
FIG. 5 is a diagram illustrating a second metal damper member and a second insulating member included in a laser chamber according to modification 1 of the first embodiment.
Figure 6:
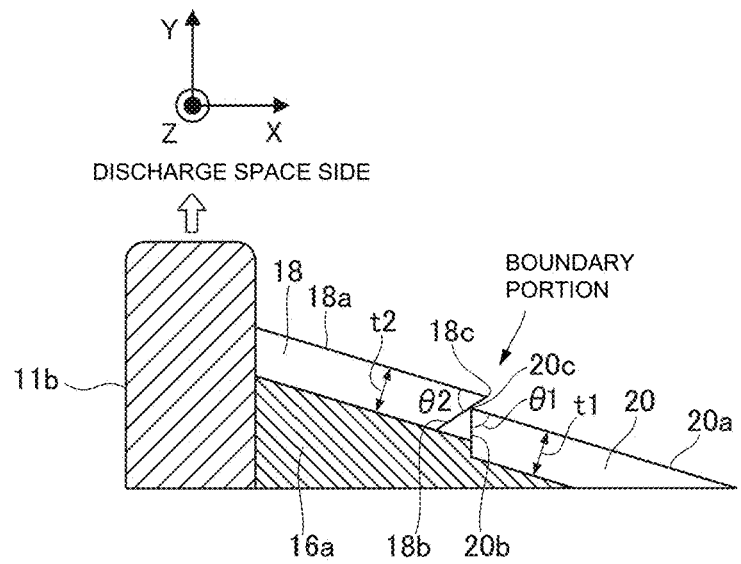
FIG. 6 is a diagram illustrating a second metal damper member and a second insulating member included in a laser chamber according to modification 2 of the first embodiment.

Referring to FIG. 4 to FIG. 6, a laser chamber 10 of the first embodiment will be described.

The laser chamber 10 of the first embodiment may be different from the laser chamber 10 of the comparative example shown in FIG. 1 to FIG. 3, mainly in the configuration of the second metal damper member 20 and the second insulating member 18.

Concerning the laser chamber 10 and a gas laser apparatus 1 of the first embodiment, the description of similar features to those of the laser chamber 10 and the gas laser apparatus 1 of the comparative example will be omitted.

3.1 Configuration

FIG. 4 is a diagram illustrating a second metal damper member 20 and a second insulating member 18, which are included in the laser chamber 10 of the first embodiment.

A discharge space side surface 20a of the second metal damper member 20 of the first embodiment may not be located in substantially the same plane as a discharge space side surface 18a of the second insulating member 18.

Specifically, in the boundary portion between the second metal damper member 20 and the second insulating member 18, the discharge space side surface 20a of the second metal damper member 20 may be located further toward the opposite side to the discharge space than the discharge space side surface 18a of the second insulating member 18. That is, the discharge space side surface 20a of the second metal damper member 20 may be in a position shifted in the negative direction of the Y-axis from the discharge space side surface 18a of the second insulating member 18.

If a metal member 16a has an inclined surface which is substantially flat, the thickness t1 of the second metal damper member 20 may be smaller than the thickness t2 of the second insulating member 18.

In addition to this feature, a corner 20c between the discharge space side surface 20a of the second metal damper member 20 and a side surface 20b of the second metal damper member 20, the side surface 20b being on the side of the second insulating member 18, may be in contact with a side surface 18b of the second insulating member 18, the side surface 18b being on the side of the second metal damper member 20.

Furthermore, the sum of the angle θ1 of the corner 20c of the second metal damper member 20 and the angle θ2 of the corner 18c of the second insulating member 18 may be smaller than 180°. That is, the angle θ1 and the angle θ2 may have a relation expressed by the following formula.

$$\theta_1 + \theta_2 < 180°$$

Here, the angle θ1 may be a value taking account of the variance due to the processing tolerance of the second metal damper member 20. That is, providing that Δθ1 represents the processing tolerance for the angle of the corner 20c and θ1' represents the designed angle of the corner 20c, the angle θ1 may be expressed by the following equation.

$$\theta_1 = \theta_1' + \Delta\theta_1$$

Like the angle θ1, the angle θ2 may be a value taking account of the variance due to the processing tolerance of the second insulating member 18.

Other features of the second metal damper member 20 and the second insulating member 18 according to the first embodiment may be the same as those of the second metal damper member 20 and the second insulating member 18 according to the comparative example.

Other features of the laser chamber 10 and the gas laser apparatus 1 of the first embodiment may be the same as those of the laser chamber 10 and the gas laser apparatus 1 of the comparative example.

3.2 Operation and Effect

As described above, in the boundary portion between the second metal damper member 20 and the second insulating member 18, the surface 20a of the second metal damper member 20 may be located further toward the opposite side to the discharge space than the surface 18a of the second insulating member 18.

Therefore, the acoustic wave generated by the main discharge can be reflected by the surface 20a of the second metal damper member 20 and the surface 18a of the second insulating member 18 and thereafter move in a direction away from the discharge space.

In addition, as described above, the corner 20c of the second metal damper member 20 may be in contact with the side surface 18b of the second insulating member 18.

Accordingly, such a gap W that is open to the discharge space side can rarely be formed in the boundary portion between the second metal damper member 20 and the second insulating member 18.

Therefore, such a problem that the acoustic wave generated by the main discharge can enter the gap W can hardly be caused in the laser chamber 10 of the first embodiment.

Thus, the laser chamber 10 of the first embodiment can prevent the acoustic wave generated by the main discharge from returning to the discharge space.

As a result, the laser chamber 10 of the first embodiment can prevent the performance of the pulse laser beam from being degraded by the influence of the acoustic wave.

Furthermore, in the laser chamber 10 of the first embodiment, since the second metal damper member 20 is formed taking account of the dimensional variance due to the processing tolerance, the acoustic wave can be prevented from returning to the discharge space, regardless of the finished condition of the products and the individual difference between the products.

As a result, the laser chamber 10 of the first embodiment can stably prevent the performance degradation of the pulse laser beam, which can be caused by the influence of the acoustic wave.

Note that the performance of the pulse laser beam may include beam profile, beam pointing, wavelength stability, spectral width, spectral waveform and the stability of pulse energy.

3.3 Modification of First Embodiment

FIG. 5 is a diagram illustrating a second metal damper member 20 and a second insulating member 18, which are included in a laser chamber 10 according to modification 1 of the first embodiment.

Like in the first embodiment, the thickness t1 of the second metal damper member 20 may be smaller than the thickness t2 of the second insulating member 18 in modification 1 of the first embodiment.

According to modification 1 of the first embodiment, unlike the first embodiment, respective surfaces of the second metal damper member 20 and the second insulating member 18, which are on the opposite side from the discharge space, may not be in substantially the same plane.

For example, a metal member 16a according to modification 1 of the first embodiment may have an inclined surface which is not substantially flat but has a stepped portion formed at a position corresponding to the boundary portion between the second metal damper member 20 and the second insulating member 18, as shown in FIG. 5.

The stepped portion may only be formed such that the surface 20a of the second metal damper member 20 disposed on the inclined surface of the metal member 16a is located further toward the opposite side to the discharge space than the surface 18a of the second insulating member 18. In other words, the stepped portion may only be formed such that the discharge space side surface 20a of the second metal damper member 20 is located in a position shifted in the negative direction of the Y-axis from the discharge space side surface 18a of the second insulating member 18. In addition, the stepped portion may only be formed such that a corner 20c of the second metal damper member 20 disposed on the inclined surface of the metal member 16a is in contact with a side surface 18b of the second insulating member 18.

That is, the inclined surface of the metal member 16a may be formed with the stepped portion which rises to the discharge space side at the position corresponding to the boundary portion between the second metal damper member 20 and the second insulating member 18.

The second metal damper member 20 and the second insulating member 18 may be fixed on the inclined surface of the metal member 16a having the stepped portion formed in the inclined surface.

Other features of the second metal damper member 20 and the second insulating member 18 according to modification 1 of the first embodiment may be the same as those of the second metal damper member 20 and the second insulating member 18 according to the first embodiment.

Other features of the laser chamber 10 and the gas laser apparatus 1 according to modification 1 of the first embodiment may be the same as those of the laser chamber 10 and the gas laser apparatus 1 of the first embodiment.

Similarly to the first embodiment, the laser chamber 10 according to modification 1 of the first embodiment can thereby prevent the acoustic wave generated by the main discharge from returning to the discharge space, making it possible to prevent the influence of the acoustic wave from degrading the performance of the pulse laser beam.

FIG. 6 is a diagram illustrating a second metal damper member 20 and a second insulating member 18, which are included in a laser chamber 10 according to modification 2 of the first embodiment.

According to modification 2 of the first embodiment, unlike the first embodiment, the thickness t1 of the second metal damper member 20 and the thickness t2 of the second insulating member 18 may be substantially equal to each other.

In this case, a metal member 16a according to modification 2 of the first embodiment may have an inclined surface which is not substantially flat but has a stepped portion formed at a position corresponding to the boundary portion between the second metal damper member 20 and the second insulating member 18, as shown in FIG. 6.

The stepped portion may only be formed such that the surface 20a of the second metal damper member 20 disposed on the inclined surface of the metal member 16a is located further toward the opposite side to the discharge space than the surface 18a of the second insulating member 18. In other words, the stepped portion may only be formed such that the discharge space side surface 20a of the second metal damper member 20 is located in a position shifted in the negative direction of the Y-axis from the discharge space side surface 18a of the second insulating member 18. In addition, the stepped portion may only be formed such that a corner 20c of the second metal damper member 20 disposed on the inclined surface of the metal member 16a is in contact with a side surface 18b of the second insulating member 18.

That is, the inclined surface of the metal member 16a may be formed with the stepped portion which falls toward the opposite side to the discharge space at the position corresponding to the boundary portion between the second metal damper member 20 and the second insulating member 18.

The second metal damper member 20 and the second insulating member 18 may be fixed on the inclined surface of the metal member 16a having the stepped portion formed in the inclined surface.

Other features of the second metal damper member 20 and the second insulating member 18 according to modification 2 of the first embodiment may be the same as those of the second metal damper member 20 and the second insulating member 18 according to the first embodiment.

Other features of the laser chamber 10 and the gas laser apparatus 1 according to modification 2 of the first embodiment may be the same as those of the laser chamber 10 and the gas laser apparatus 1 of the first embodiment.

Similarly to the first embodiment, the laser chamber 10 according to modification 2 of the first embodiment can thereby prevent the acoustic wave generated by the main discharge from returning to the discharge space, making it possible to prevent the influence of the acoustic wave from degrading the performance of the pulse laser beam.

4. Second Embodiment

Figure 7:
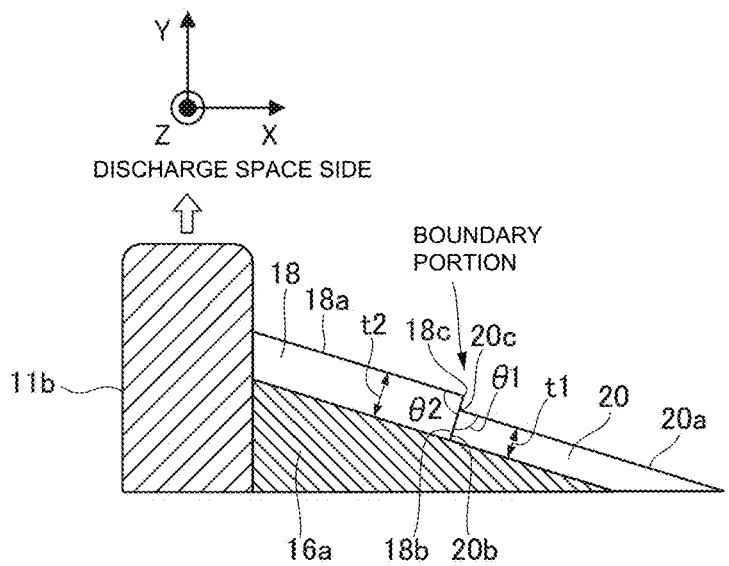
FIG. 7 is a diagram illustrating a second metal damper member and a second insulating member included in a laser chamber according to a second embodiment.
Figure 8:
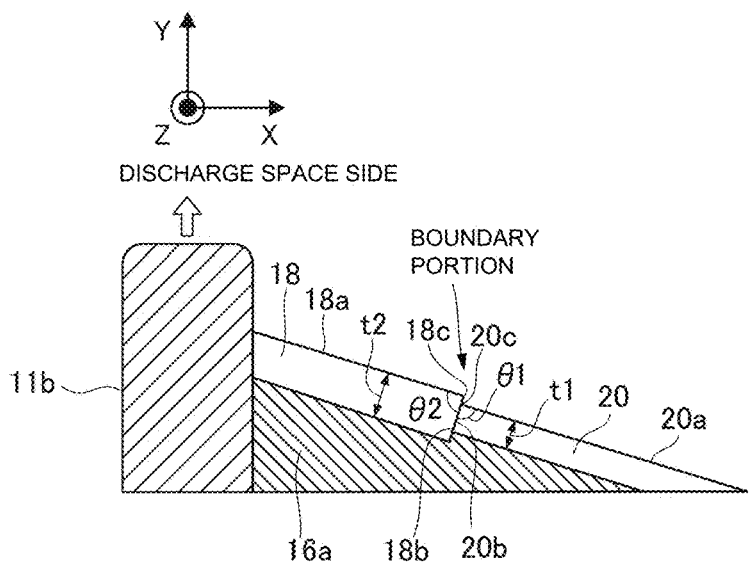
FIG. 8 is a diagram illustrating a second metal damper member and a second insulating member included in a laser chamber according to modification 1 of the second embodiment.
Figure 9:
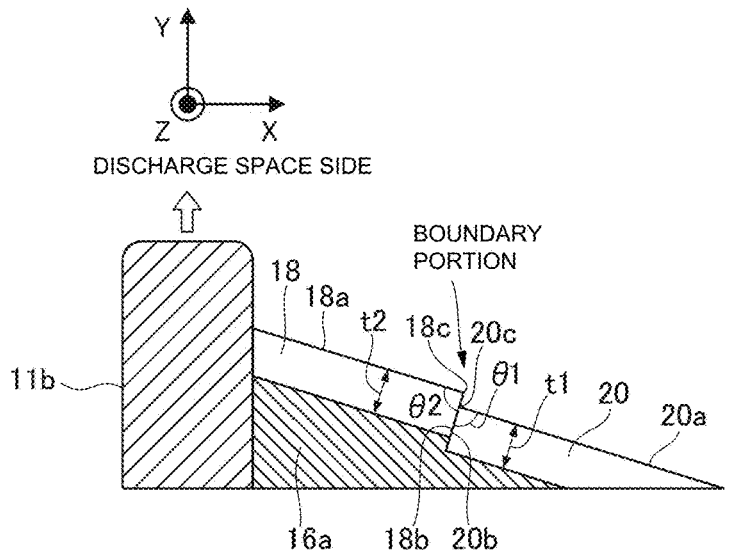
FIG. 9 is a diagram illustrating a second metal damper member and a second insulating member included in a laser chamber according to modification 2 of the second embodiment.

Referring to FIG. 7 to FIG. 9, a laser chamber 10 of the second embodiment will be described.

The first embodiment has been described above with reference to those cases where the sum of the angle θ1 of the second metal damper member 20 and the angle θ2 of the second insulating member 18 is smaller than 180°.

However, the present disclosure is not limited to the abovementioned relationship between the angle θ1 of the second metal damper member 20 and the angle θ2 of the second insulating member 18.

Concerning the laser chamber 10 and a gas laser apparatus 1 of the second embodiment, the description of similar features to those of the laser chamber 10 and the gas laser apparatus 1 of the first embodiment will be omitted.

4.1 Configuration, Operation and Effect

FIG. 7 is a diagram illustrating a second metal damper member 20 and a second insulating member 18, which are included in the laser chamber 10 of the second embodiment.

According to the second embodiment, like the first embodiment, the thickness t1 of the second metal damper member 20 may be smaller than the thickness t2 of the second insulating member 18.

Unlike the first embodiment, the sum of the angle θ1 of the second metal damper member 20 and the angle θ2 of the second insulating member 18 may be substantially 180° in the second embodiment.

For example, according to the second embodiment, each of the angle θ1 of the second metal damper member 20 and the angle θ2 of the second insulating member 18 may be substantially 90°, as shown in FIG. 7.

However, according to the second embodiment, the second metal damper member 20 and the second insulating member 18 may have the following relationship, as with the first embodiment.

That is, in the boundary portion between the second metal damper member 20 and the second insulating member 18, a discharge space side surface 20a of the second metal damper member 20 may be located further toward the opposite side to the discharge space than a discharge space side surface 18a of the second insulating member 18. That is, the discharge space side surface 20a of the second metal damper member 20 may be in a position shifted in the negative direction of the Y-axis from the discharge space side surface 18a of the second insulating member 18. In addition, a corner 20c between the discharge space side surface 20a of the second metal damper member 20 and a side surface 20b of the second metal damper member 20 may be in contact with a side surface 18b of the second insulating member 18, in which the side surface 20b is on the side of the second insulating member 18 and the side surface 18b is on the side of the second metal damper member 20.

Furthermore, according to the second embodiment, the side surface 20b of the second metal damper member 20 may be bonded to the side surface 18b of the second insulating member 18.

Other features of the second metal damper member 20 and the second insulating member 18 according to the second embodiment may be the same as those of the second metal damper member 20 and the second insulating member 18 according to the first embodiment.

Other features of the laser chamber 10 and a gas laser apparatus 1 of the second embodiment may be the same as those of the laser chamber 10 and the gas laser apparatus 1 of the first embodiment.

Similarly to the first embodiment, the laser chamber 10 of the second embodiment can thereby prevent the acoustic wave generated by the main discharge from returning to the discharge space, making it possible to prevent the influence of the acoustic wave from degrading the performance of the pulse laser beam.

4.2 Modification of Second Embodiment

FIG. 8 is a diagram illustrating a second metal damper member 20 and a second insulating member 18, which are included in a laser chamber 10 according to modification 1 of the second embodiment.

According to modification 1 of the second embodiment, like modification 1 of the first embodiment, the thickness t1 of the second metal damper member 20 may be smaller than the thickness t2 of the second insulating the member 18.

According to modification 1 of the second embodiment, like modification 1 of the first embodiment, respective surfaces of the second metal damper member 20 and the second insulating member 18, which are on the opposite side from the discharge space, may not be in substantially the same plane.

That is, according to modification 1 of the second embodiment, an inclined surface of a metal member 16a may have a stepped portion formed at a position corresponding to the boundary portion between the second metal damper member 20 and the second insulating member 18. Specifically, as with modification 1 of the first embodiment, the inclined surface of the metal member 16a may be formed with the stepped portion which rises to the discharge space side at the position corresponding to the boundary portion between the second metal damper member 20 and the second insulating member 18. The second metal damper member 20 and the second insulating member 18 may be fixed on the inclined surface of the metal member 16a having the stepped portion formed in the inclined surface.

Other features of the second metal damper member 20 and the second insulating member 18 according to modification 1 of the second embodiment may be the same as those of the second metal damper member 20 and the second insulating member 18 according to the second embodiment.

Other features of the laser chamber 10 and a gas laser apparatus 1 according to modification 1 of the second embodiment may be the same as those of the laser chamber 10 and the gas laser apparatus 1 of the second embodiment.

FIG. 9 is a diagram illustrating a second metal damper member 20 and a second insulating member 18, which are included in a laser chamber 10 according to modification 2 of the second embodiment.

According to modification 2 of the second embodiment, like modification 2 of the first embodiment, the thickness t1 of the second metal damper member 20 may be substantially equal to the thickness t2 of the second insulating member 18.

According to modification 2 of the second embodiment, a metal member 16a may have an inclined surface which has a step portion formed at a position corresponding to the boundary portion between the second metal damper member 20 and the second insulating member 18. Specifically, as with modification 2 of the first embodiment, the inclined surface of the metal member 16a may be formed with the stepped portion which falls toward the opposite side to the discharge space at the position corresponding to the boundary portion between the second metal damper member 20 and the second insulating member 18. The second metal damper member 20 and the second insulating member 18 may be fixed on the inclined surface of the metal member 16a having the stepped portion formed in the inclined surface.

Other features of the second metal damper member 20 and the second insulating member 18 according to modification 2 of the second embodiment may be the same as those of the second metal damper member 20 and the second insulating member 18 according to the second embodiment.

Other features of the laser chamber 10 and a gas laser apparatus 1 according to modification 2 of the second embodiment may be the same as those of the laser chamber 10 and the gas laser apparatus 1 of the second embodiment.

5. Third Embodiment

Figure 10:
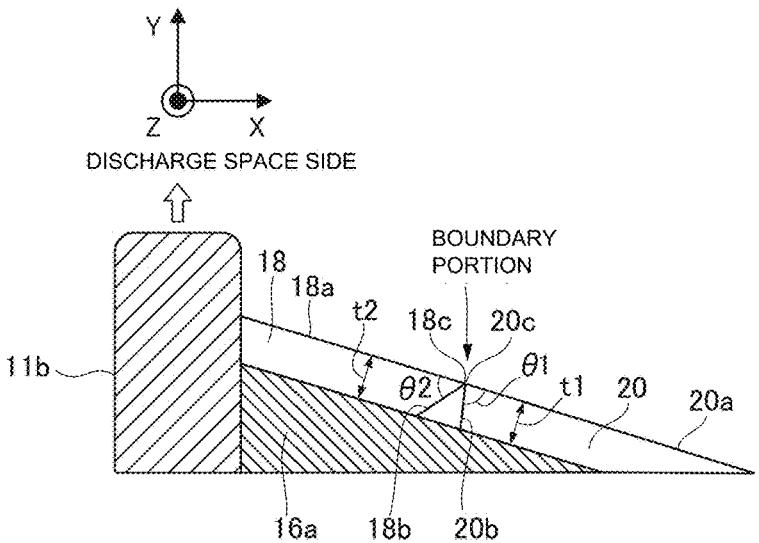
FIG. 10 is a diagram illustrating a second metal damper member and a second insulating member included in a laser chamber according to a third embodiment.
Figure 11:
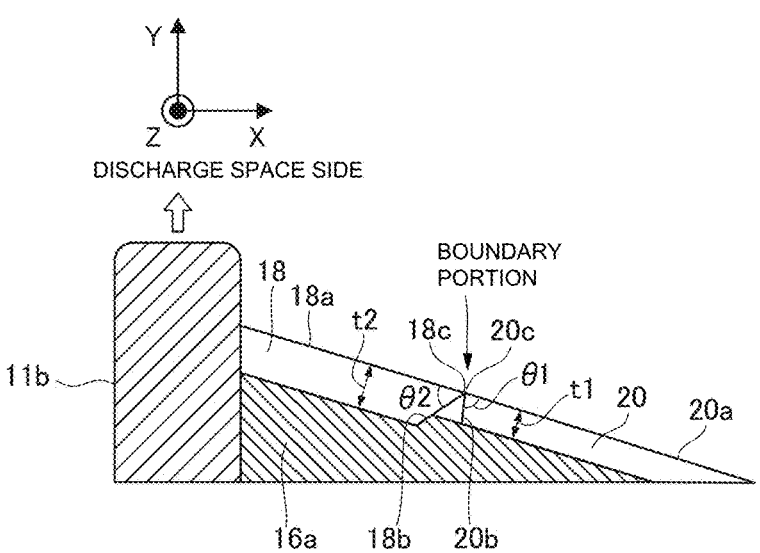
FIG. 11 is a diagram illustrating a second metal damper member and a second insulating member included in a laser chamber according to modification 1 of the third embodiment.
Figure 12:
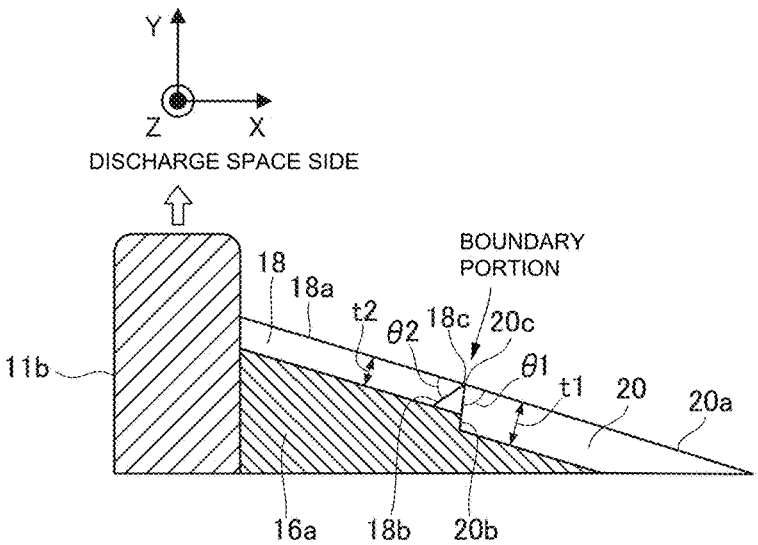
FIG. 12 is a diagram illustrating a second metal damper member and a second insulating member included in a laser chamber according to modification 2 of the third embodiment.

Referring to FIG. 10 to FIG. 12, a laser chamber 10 of the third embodiment will be described.

In the first and second embodiments described above, the discharge space side surface 20a of the second metal damper member 20 and the discharge space side surface 18a of the second insulating member 18 are located in different planes.

However, the present disclosure is not limited to the abovementioned relationship between the surface 20a of the second metal damper member 20 and the surface 18a of the second insulating member 18.

In the description of the laser chamber 10 and a gas laser apparatus 1 of the third embodiment, the description of similar features to those of the laser chamber 10 and the gas laser apparatus 1 of the first embodiment will be omitted.

5.1 Configuration, Operation and Effect

FIG. 10 is a diagram illustrating a second metal damper member 20 and the second insulating member 18, which are included in a laser chamber 10 of the third embodiment.

According to the third embodiment, a discharge space side surface 20a of the second metal damper member 20 may be located in substantially the same plane as a discharge space side surface 18a of the second insulating member 18.

If a metal member 16a has an inclined surface which is substantially flat, the thickness t1 of the second metal damper member 20 may be substantially equal to the thickness t2 of the second insulating member 18.

In addition, a corner 20c of the second metal damper member 20 may be in contact with a corner 18c of the second insulating member 18.

Furthermore, the sum of the angle θ1 of the corner 20c of the second metal damper member 20 and the angle θ2 of the corner 18c of the second insulating member 18 may be smaller than 180°.

Other features of the second metal damper member 20 and the second insulating member 18 according to the third embodiment may be the same as those of the second metal damper member 20 and the second insulating member 18 according to the first embodiment.

Other features of the laser chamber 10 and a gas laser apparatus 1 of the third embodiment may be the same as those of the laser chamber 10 and the gas laser apparatus 1 of the first embodiment.

Similarly to the first embodiment, the laser chamber 10 of the third embodiment can thereby prevent the acoustic wave generated by the main discharge from returning to the discharge space, making it possible to prevent the influence of the acoustic wave from degrading the performance of the pulse laser beam.

5.2 Modification of Third Embodiment

FIG. 11 is a diagram illustrating a second metal damper member 20 and a second insulating member 18, which are included in a laser chamber 10 according to modification 1 of the third embodiment.

According to modification 1 of the third embodiment, unlike the third embodiment, the thickness t1 of the second metal damper member 20 may be smaller than the thickness t2 of the second insulating member 18.

According to modification 1 of the third embodiment, like modification 1 of the first embodiment, respective surfaces of the second metal damper member 20 and the second insulating member 18, which are on the opposite side from the discharge space, may not be in substantially the same plane.

That is, according to modification 1 of the third embodiment, a metal member 16a may have an inclined surface which is formed with a stepped portion at a position corresponding to the boundary portion between the second metal damper member 20 and the second insulating member 18. Specifically, as with modification 1 of the first embodiment, the inclined surface of the metal member 16a may be formed with the stepped portion which rises to the discharge space side at the position corresponding to the boundary portion between the second metal damper member 20 and the second insulating member 18. The second metal damper member 20 and the second insulating member 18 may be fixed on the inclined surface of the metal member 16a having the stepped portion formed in the inclined surface.

Other features of the second metal damper member 20 and the second insulating member 18 according to modification 1 of the third embodiment may be the same as those of the metal damper member 20 and the second insulating member 18 according to the third embodiment.

Other features of the laser chamber 10 and a gas laser apparatus 1 according to modification 1 of the third embodiment may be the same as those of the laser chamber 10 and the gas laser apparatus 1 of the third embodiment.

FIG. 12 is a diagram illustrating a second metal damper member 20 and a second insulating member 18, which are included in the laser chamber 10 according to modification 2 of the third embodiment.

According to modification 2 of the third embodiment, the thickness t1 of the second metal damper member 20 may be greater than the thickness t2 of the second insulating member 18.

According to modification 2 of the third embodiment, a metal member 16a may have an inclined surface which is formed with a stepped portion at a position corresponding to the boundary portion between the second metal damper member 20 and the second insulating member 18. Specifically, as with modification 2 of the first embodiment, the inclined surface of the metal member 16a may be formed with the stepped portion which falls toward the opposite side to the discharge space at the position corresponding to the boundary portion between the second metal damper member 20 and the second insulating member 18. The second metal damper member 20 and the second insulating member 18 may be fixed on the inclined surface of the metal member 16a, which is formed with the stepped portion.

Other features of the second metal damper member 20 and the second insulating member 18 according to modification 2 of the third embodiment may be the same as those of the second metal damper member 20 and the second insulating member 18 according to the third embodiment.

Other features of the laser chamber 10 and a gas laser apparatus 1 according to modification 2 of the third embodiment may be the same as those of the laser chamber 10 and the gas laser apparatus 1 of the third embodiment.

6. Fourth Embodiment

Referring to FIG. 13 to FIG. 17, a laser chamber 10 of the fourth embodiment will be described.

The first to third embodiments described above are configured such that the gap W open to the discharge space side can hardly be formed in the boundary portion between the second metal damper member 20 and the second insulating member 18.

However, according to the present disclosure, a gap W open to the discharge space side may as well be formed in the boundary portion between a second metal damper member 20 and a second insulating member 18, like the boundary portion according to the comparative example.

Regarding the laser chamber 10 and a gas laser apparatus 1 of the fourth embodiment, the description of the same components as those of the laser chamber 10 and the gas laser apparatus 1 of the comparative example will be omitted.

6.1 Configuration

Figure 13:
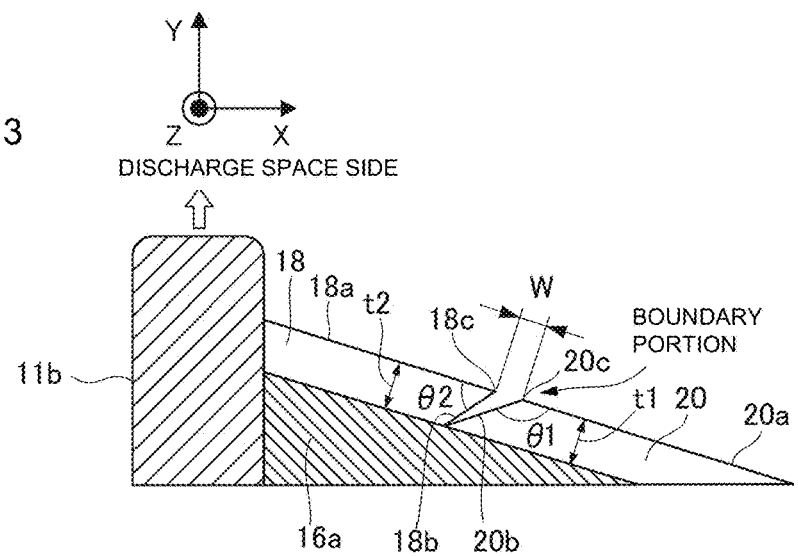
FIG. 13 is a diagram illustrating a second metal damper member and a second insulating member included in a laser chamber according to a fourth embodiment.
Figure 14:
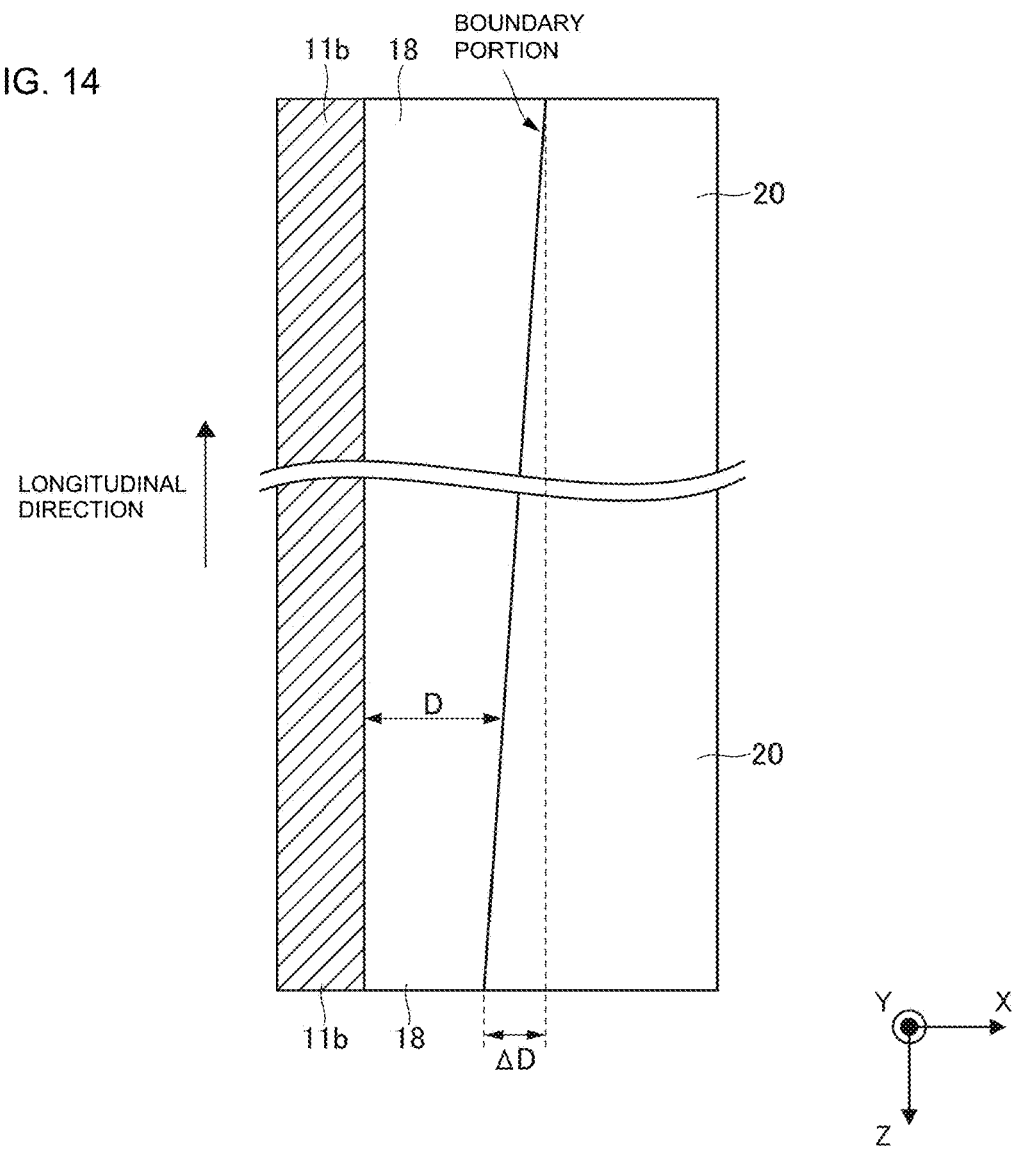
FIG. 14 is a schematic diagram illustrating the second metal damper member, the second insulating member and a second discharge electrode, shown in FIG. 13, as viewed from the Y-axis direction.

FIG. 13 is a diagram illustrating a second metal damper member 20 and a second insulating member 18, which are included in the laser chamber 10 of the fourth embodiment. FIG. 14 is a schematic diagram illustrating the second metal damper member 20, the second insulating member 18 and a second discharge electrode 11b shown in FIG. 13, as viewed from the Y-axis direction. In FIG. 13 and FIG. 14, X-, Y- and Z-axes are shown in one corner of each drawing in order to clearly illustrate the components.

According to the fourth embodiment, the boundary portion between the second metal damper member 20 and the second insulating member 18 may have a changing distance D from the second discharge electrode 11b; the distance D may change from one position to another in the longitudinal direction of the second discharge electrode 11b.

For example, according to the fourth embodiment, the distance D from the second discharge electrode 11b to the boundary portion between the second metal damper member 20 and the second insulating member 18 may increase monotonically from one position to another in the longitudinal direction of the second discharge electrode 11b, as shown in FIG. 14. Alternatively, according to the fourth embodiment, the distance D from the second discharge electrode 11b to the boundary portion between the second metal damper member 20 and the second insulating member 18 may decrease monotonically from one position to another in the longitudinal direction of the second discharge electrode 11b.

That is, according to the fourth embodiment, the boundary portion between the second metal damper member 20 and the second insulating member 18 may be formed along a straight line that slants relative to the longitudinal direction of the second discharge electrode 11b by an amount $\Delta D$ corresponding to the change of the distance D, when viewed from the Y-axis direction.

In this case of the fourth embodiment, the size in the flowing direction of the laser gas, i.e. the width in this example, of each of the second metal damper member 20 and the second insulating member 18 may change monotonically from one position to another in the longitudinal direction of the second discharge electrode 11b.

Other features of the second metal damper member 20 and the second insulating member 18 according to the fourth embodiment may be the same as those of the second metal damper member 20 and the second insulating member 18 according to the comparative example.

Other features of the laser chamber 10 and a gas laser apparatus 1 of the fourth embodiment may be the same as those of the laser chamber 10 and the gas laser apparatus 1 of the comparative example.

6.2 Operation and Effect

The acoustic wave generated by the main discharge can enter the gap W and can be reflected therefrom.

However, the time point at which the acoustic wave is reflected from the gap W can vary depending on the distance D from the second discharge electrode 11b to the boundary portion between the second metal damper member 20 and the second insulating member 18.

Providing that the velocity of the acoustic wave is represented by V, the time point at which the acoustic wave is reflected from the gap W can be shifted by $\Delta D/V$ from one position to another in the longitudinal direction of the second discharge electrode 11b. Then, based on the value $\Delta D/V$, the acoustic wave can return to the discharge space at different time points spatially dispersed in the longitudinal direction of the second discharge electrode 11b.

Therefore, in the laser chamber 10 of the fourth embodiment, the value $\Delta D$ may be adjusted to the extent that the performance of the pulse laser beam will not be degraded by the acoustic wave even if the acoustic wave generated by the main discharge may return to the discharge space.

Thus, in the laser chamber 10 of the fourth embodiment, the acoustic wave generated by the main discharge can return to the discharge space at dispersed time points.

As a result, the laser chamber 10 of the fourth embodiment can prevent the influence of the acoustic wave from degrading the performance of the pulse laser beam.

Note that the feature of the second metal damper member 20 and the second insulating member 18 according to the fourth embodiment may be combined with any of the technical features which have been described in the first to third embodiments and the modifications thereof. That is, the relationship between the surfaces 20a and 18a, the relationship between the angles θ1 and θ2, as well as the relationship between the thicknesses t1 and t2, described above in any of the first to third embodiments and the modifications thereof, may also be applicable to the metal damper member 20 and the second insulating member 18 according to the fourth embodiment.

As a result, the laser chamber 10 of the fourth embodiment can prevent the influence of the acoustic wave from degrading the performance of the pulse laser beam, more effectively than the laser chambers 10 of the first to third embodiments.

6.3 Modification of Fourth Embodiment

Figure 15:
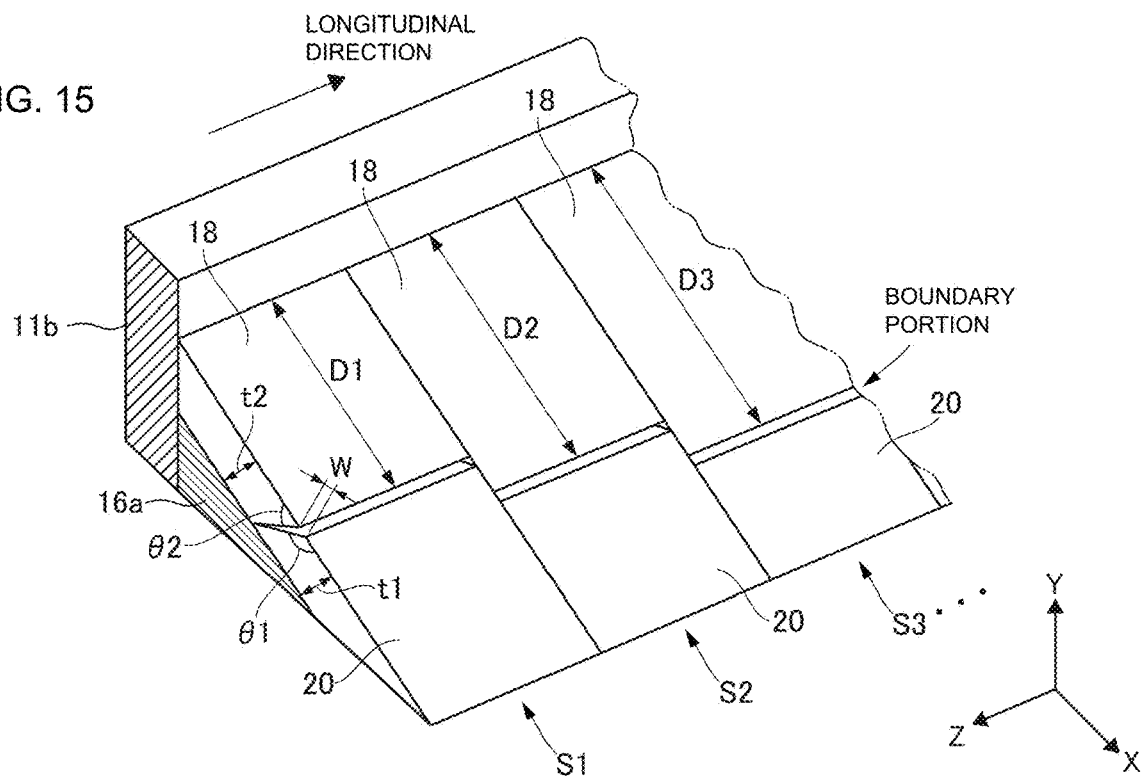
FIG. 15 is a diagram illustrating a second metal damper member and a second insulating member included in a laser chamber according to modification 1 of the fourth embodiment.
Figure 16:
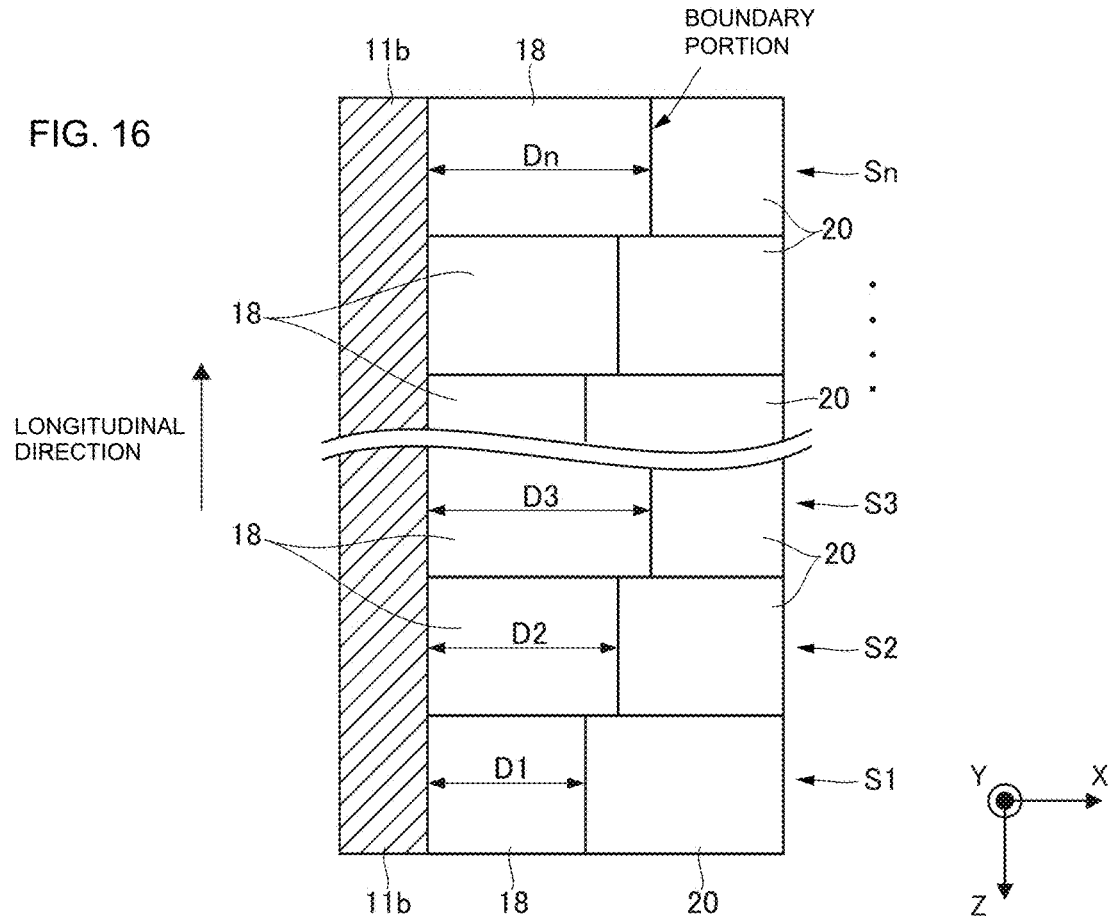
FIG. 16 is a schematic diagram illustrating the second metal damper member, the second insulating member and a second discharge electrode, shown in FIG. 15, as viewed from the Y-axis direction.

FIG. 15 is a diagram illustrating a second metal damper member 20 and a second insulating member 18 included in a laser chamber 10 according to modification 1 of the fourth embodiment. FIG. 16 is a schematic diagram illustrating the second metal damper member 18, the second insulating member 20 and a second discharge electrode 11b shown in FIG. 15, as viewed from the Y-axis direction. In FIG. 15 and FIG. 16, X-, Y- and Z-axes are shown in one corner of each drawing in order to clearly illustrate the components.

According to modification 1 of the fourth embodiment, the distance D from the second discharge electrode 11b to the boundary portion between the second metal damper member 20 and the second insulating member 18 may change discontinuously from one position to another in the longitudinal direction of the second discharge electrode 11b.

That is, according to modification 1 of the fourth embodiment, the boundary portion between the second metal damper member 20 and the second insulating member 18 may not necessarily be formed on a single line as viewed from the Y-axis direction.

Specifically, according to modification 1 of the fourth embodiment, the second metal damper member 20 and the second insulating member 18 may be divided into multiple sections S1 to Sn in the longitudinal direction of the second discharge electrode 11b. Then, distances D from the second discharge electrode 11b to boundary portions between the second metal damper member 20 and the second insulating member 18 in the multiple sections S1 to Sn can be referred to as distances D1 to Dn, respectively. Here, "n" can be a natural number greater than or equal to 2.

In addition, at least between two sections S of the multiple sections S1 to Sn, the distances D from the second discharge electrode 11b to the boundary portions may be different from one another. That is, at least two distances D may be different from each other among the distances D1 to Dn.

Here, it may be preferable to change the distance D between the adjacent sections S, because the time points at which the acoustic wave returns to the discharge space will be dispersed more easily when the distances D1 to Dn from the second discharge electrode 11b to the boundary portions differ from each other between the adjacent sections S.

Also, it may be preferable to provide a greater number of divisional sections S1 to Sn because the greater number of sections S1 to Sn can make it easier to provide a wide diversity of distances D1 to Dn from the second discharge electrode 11b to the boundary portions, which makes it easier to disperse the time points at which the acoustic wave returns to the discharge space.

Other features of the second metal damper member 20 and the second insulating member 18 according to modification 1 of the fourth embodiment may be the same as those of the second metal damper member 20 and the second insulating member 18 according to the fourth embodiment.

Other features of the laser chamber 10 and a gas laser apparatus 1 according to modification 1 of the fourth embodiment may be the same as those of the laser chamber 10 and the gas laser apparatus 1 of the fourth embodiment.

FIG. 17 is a diagram illustrating a second metal damper member 20 and a second insulating member 18 included in a laser chamber 10 according to modification 2 of the fourth embodiment. In FIG. 17, X-, Y- and Z-axes are shown in one corner of the drawing in order to clearly illustrate the components.

According to modification 2 of the fourth embodiment, distances D1 to Dn from the second discharge electrode 11b to boundary portions between the second metal damper member 20 and the second insulating member 18 may change individually within each of multiple sections S1 to Sn in the longitudinal direction of the second discharge electrode 11b.

Other features of the second metal damper member 20 and the second insulating member 18 according to modification 2 of the fourth embodiment may be the same as those of the second metal damper member 20 and the second insulating member 18 according to modification 1 of the fourth embodiment.

Other features of the laser chamber 10 and a gas laser apparatus 1 according to modification 2 of the fourth embodiment may be the same as those of the laser chamber 10 and the gas laser apparatus 1 according to modification 1 of the fourth embodiment.

Thereby, the laser chamber 10 according to modification 2 of the fourth embodiment can prevent the influence of the acoustic wave from degrading the performance of the pulse laser beam more effectively than the laser chamber 10 of modification 1 of the fourth embodiment.

7. Others

The gas laser apparatus 1 is not limited to an excimer laser apparatus, but may be a fluorine molecular laser apparatus that uses a laser gas including a fluorine gas and a buffer gas.

The first discharge electrode 11a may be an anode electrode instead of the cathode electrode. The second discharge electrode 11b may be a cathode electrode instead of the anode electrode.

It should be appreciated for a person skilled in the art that the respective features of the above-described embodiments, including the modifications, are applicable to one another.

The foregoing description is intended to be merely illustrative rather than limiting. It should therefore be appreciated for a person skilled in the art that variations may be made in the embodiments of the present disclosure without departing from the scope as defined by the appended claims.

The terms used throughout the specification and the appended claims are to be construed as "open-ended" terms. For example, the term "include" or "included" is to be construed as "including but not limited to". The term "have" is to be construed as "having but not limited to". Also, the modifier "one (a/an)" described in the specification and recited in the appended claims is to be construed to mean "at least one" or "one or more".

What is claimed is:

1. A laser chamber of a discharge excitation type gas laser apparatus, comprising:
   a first discharge electrode disposed in the laser chamber;
   a second discharge electrode disposed as facing the first discharge electrode in the laser chamber;
   a fan configured to make a laser gas flow along a flow path in a flow direction through a discharge space between the first and second discharge electrodes, the flow direction being perpendicular to a central axis of the discharge space extending from the first discharge electrode to the second discharge electrode;

a first insulating member disposed in positions upstream and downstream from the first discharge electrode in the flow direction;

a first metal damper member disposed in a position upstream from the second discharge electrode in the flow direction;

a second insulating member disposed in a position downstream from the second discharge electrode in the flow direction; and a second metal damper member disposed in a position downstream from the second insulating member in the flow direction, wherein, the second metal damper member includes a first surface facing the flow path of the laser gas between the second metal damper member and the first insulating member, a first side surface being on an upstream side of the second metal damper member in the flow direction, and a first corner formed by the first surface and the first side surface, the second insulating member includes a second surface facing the flow path of the laser gas between the second insulating member and the first insulating member, a second side surface being on a downstream side of the second insulating member in the flow direction, and a second corner formed by the second surface and the second side surface, the first corner is in contact with the second side surface, and the second corner is positioned farther from the second discharge electrode than the first corner in the flow direction.

2. The laser chamber set forth in claim 1, wherein the first surface is inclined such that a distance from the first insulating member to the first surface in a direction transverse to the flow direction increases as a distance from the second discharge electrode to the first surface in the flow direction increases, and the second surface is inclined such that a distance from the first insulating member to the second surface in a direction transverse to the flow direction increases as a distance from the second discharge electrode to the second surface in the flow direction increases.

3. The laser chamber set forth in claim 2, wherein the sum of the angle of the first corner and the angle of the second corner is smaller than 180°.

4. A laser chamber of a discharge excitation type gas laser apparatus, comprising:
a first discharge electrode disposed in the laser chamber;
a second discharge electrode disposed as facing the first discharge electrode in the laser chamber;
a fan configured to make a laser gas flow in a flow direction through a discharge space between the first and second discharge electrodes;
a first insulating member disposed in positions upstream and downstream from the first discharge electrode in the flow direction;
a first metal damper member disposed in a position upstream from the second discharge electrode in the flow direction;
a second insulating member disposed in a position downstream from the second discharge electrode in the flow direction, the second insulating member being directly adjacent to a side surface on a downstream side of the second discharge electrode in the flow direction; and
a second metal damper member disposed in a position downstream from the second insulating member in the flow direction, wherein,
the second metal damper member includes a first surface facing the flow path of the laser gas between the second metal damper member and the first insulating member, a first side surface being on an upstream side of the second metal damper member in the flow direction, and a first corner formed by the first surface and the first side surface,
the second insulating member includes a second surface facing the flow path of the laser gas between the second insulating member and the first insulating member, a second side surface being on a downstream side of the second insulating member in the flow direction, and a second corner formed by the second surface and the second side surface, and
the first corner is in contact with the second side surface such that the first corner divides the second side surface into a first portion exposed to the flow path and a second portion separated from the flow path.

5. The laser chamber set forth in claim 4, wherein the first surface is inclined such that a distance from the first insulating member to the first surface in a direction transverse to the flow direction increases as a distance from the second discharge electrode to the first surface in the flow direction increases, and the second surface is inclined such that a distance from the first insulating member to the second surface in a direction transverse to the flow direction increases as a distance from the second discharge electrode to the second surface in the flow direction increases.

6. The laser chamber set forth in claim 5, wherein the sum of the angle of the first corner and the angle of the second corner is smaller than 180°.

* * * * *